United States Patent
Sakamoto et al.

(10) Patent No.: US 10,477,692 B2
(45) Date of Patent: Nov. 12, 2019

(54) PRINTED BOARD, LIGHT SOURCE DEVICE, SEMICONDUCTOR DEVICE, AND METHODS OF MANUFACTURING SAME

(71) Applicant: NICHIA CORPORATION, Anan-shi (JP)

(72) Inventors: Masakazu Sakamoto, Tokushima (JP); Masaaki Katsumata, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/145,186

(22) Filed: Sep. 28, 2018

(65) Prior Publication Data

US 2019/0104617 A1 Apr. 4, 2019

(30) Foreign Application Priority Data

Sep. 29, 2017 (JP) ................................. 2017-190750

(51) Int. Cl.
| | |
|---|---|
| H05K 1/18 | (2006.01) |
| H05K 1/02 | (2006.01) |
| H05K 3/32 | (2006.01) |
| H05K 3/38 | (2006.01) |
| H05K 3/06 | (2006.01) |
| H05K 3/00 | (2006.01) |
| H05K 3/30 | (2006.01) |
| H05K 1/11 | (2006.01) |
| H01L 33/62 | (2010.01) |

(52) U.S. Cl.
CPC ............ *H05K 3/061* (2013.01); *H05K 1/115* (2013.01); *H05K 1/181* (2013.01); *H05K 3/0032* (2013.01); *H05K 3/303* (2013.01); *H01L 33/62* (2013.01); *H01L 2933/0066* (2013.01); *H05K 2201/10106* (2013.01); *H05K 2203/107* (2013.01); *H05K 2203/166* (2013.01)

(58) Field of Classification Search
CPC .... H05K 1/0296; H05K 1/0298; H05K 1/181; H05K 3/303; H05K 3/32; H05K 3/386
See application file for complete search history.

(56) References Cited

FOREIGN PATENT DOCUMENTS

| | | | |
|---|---|---|---|
| JP | 3645926 | B2 | 6/1996 |
| JP | 4035981 | B2 | 5/2003 |
| JP | 4966508 | B2 | 10/2006 |
| JP | 2013-254921 | | 12/2013 |

*Primary Examiner* — Jeremy C Norris
(74) *Attorney, Agent, or Firm* — Mori & Ward, LLP

(57) ABSTRACT

A method of manufacturing a printed board includes perforating a metal foil with a laser beam or punching to provide a through-hole extending in a thickness direction along a thickness of the printed board. An insulating layer is provided. The metal foil having the through-hole is provided on the insulating layer in the thickness direction. An adhesive is provided between the insulating layer and the metal foil having the through-hole. The metal foil is pressed toward the insulating layer to bond the metal foil to the insulating layer via the adhesive. A mask is provided on the metal foil in the thickness direction to cover at least a part of the through-hole without covering an exposed part of the metal foil. The exposed part of the metal foil is etched to provide a wiring pattern on the insulating layer.

20 Claims, 13 Drawing Sheets

PRINTED BOARD, LIGHT SOURCE DEVICE, SEMICONDUCTOR DEVICE, AND METHODS OF MANUFACTURING SAME

CROSS-REFERENCE TO RELATED APPLICATION

This application claims priority under 35 U.S.C. § 119 to Japanese Patent Application No. 2017-190750 filed on Sep. 29, 2017, the contents of this application are hereby incorporated herein by reference in their entirety.

BACKGROUND

Technical Field

This disclosure relates to a printed board, a light source device, a semiconductor device, and methods of manufacturing the same.

Description of the Related Art

A subtractive method has heretofore been the mainstream of a method of forming a printed board. The subtractive method has a limitation in reducing an interval between adjacent wires due to a problem of side etching in an etching process. This is why the method of forming a printed board is being shifted to a semi-additive method. The semi-additive method involves an etching process to form a plated layer and then to remove an unnecessary area of a plating substrate layer (see Japanese Patent No. 3645926).

SUMMARY

A method of manufacturing a printed board according to an embodiment of this disclosure includes perforating a metal foil with a laser beam or punching to provide a through-hole extending in a thickness direction along a thickness of the printed board. An insulating layer is provided. The metal foil having the through-hole is provided on the insulating layer in the thickness direction. An adhesive is provided between the insulating layer and the metal foil having the through-hole. The metal foil is pressed toward the insulating layer to bond the metal foil to the insulating layer via the adhesive. A mask is provided on the metal foil in the thickness direction to cover at least a part of the through-hole without covering an exposed part of the metal foil. The exposed part of the metal foil is etched to provide a wiring pattern on the insulating layer.

A method of manufacturing a printed board according to another embodiment of this disclosure includes perforating a metal foil with a laser beam or punching to provide a through-hole extending in a thickness direction along a thickness of the printed board. An uncured insulating layer is provided. The metal foil having the through-hole is provided on the uncured insulating layer in the thickness direction. The metal foil is pressed toward the insulating layer to bond the metal foil to the insulating layer. A mask is provided on the metal foil in the thickness direction to cover at least a part of the through-hole without covering an exposed part of the metal foil. The exposed part of the metal foil is etched to provide a wiring pattern.

A printed board according to further embodiment of this disclosure includes an insulating layer, an adhesive layer on the insulating layer, and a wiring pattern provided on the adhesive layer. The adhesive layer has an adhesive layer bottom surface contacting the insulating layer and an adhesive layer top surface opposite to the adhesive layer bottom surface in a thickness direction along a thickness of the printed board. The wiring pattern has a wiring pattern bottom surface contacting the adhesive layer and a wiring pattern top surface opposite to the wiring pattern bottom surface in the thickness direction. The wiring pattern includes two wiring portions on which two adjacent terminals of an electronic component to be mounted, respectively. Each of side surfaces of the two wiring portions opposed to each other has an inclination angle with respect to the insulating layer in a range from 85° to 95° inclusive. Each of other side surfaces of the wiring portions has an inclination angle with respect to the insulating layer equal to or above 95°. The adhesive layer top surface between the two wiring portions is provided between the wiring pattern bottom surface and the wiring pattern top surface in the thickness direction.

A printed board according to further embodiment of this disclosure includes an insulating layer having an insulating layer top surface and a wiring pattern provided on the insulating layer top surface. The wiring pattern has a wiring pattern bottom surface contacting the insulating layer top surface and a wiring pattern top surface opposite to the wiring pattern bottom surface in a thickness direction along a thickness of the printed board. The wiring pattern includes two wiring portions on which two adjacent terminals of an electronic component to be mounted, respectively. Each of side surfaces of the two wiring portions opposed to each other has an inclination angle with respect to the insulating layer in a range from 85° to 95° inclusive. Each of other side surfaces of the wiring portions has an inclination angle with respect to the insulating layer equal to or above 95°. The insulating layer top surface between the two wiring portions is provided between the wiring pattern bottom surface and the wiring pattern top surface in the thickness direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF THE EMBODIMENTS

Figure 1:
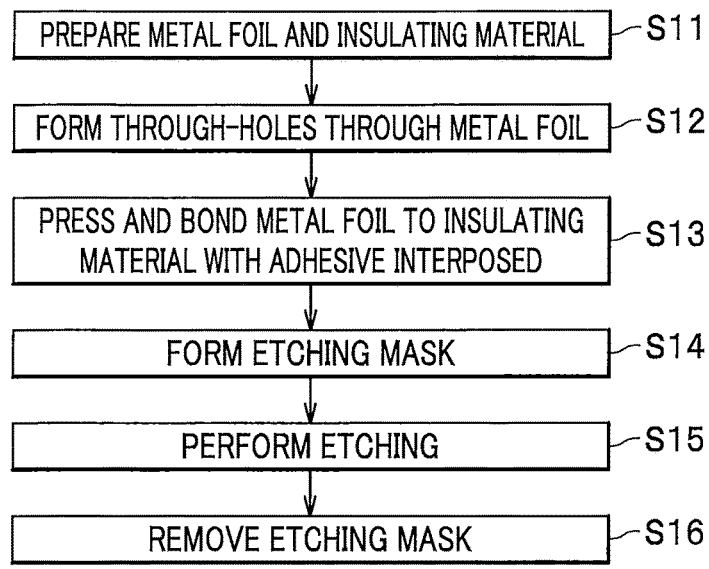
FIG. 1 is a flowchart showing procedures of a method of manufacturing a printed board according to a first embodiment.

The embodiments will now be described with reference to the accompanying drawings, wherein like reference numerals designate corresponding or identical elements throughout the various drawings.

A printed board, a light source device, a semiconductor device, and methods of manufacturing the same according to embodiments of the present invention will be described below. Note that the drawings to be referred to in conjunction with the following description schematically illustrate embodiments of the present invention. Accordingly, scales, intervals, positional relations, and the like of components may be exaggerated or illustration of the components may be partially omitted as appropriate. Meanwhile, there may be a case where scales or intervals of the components do not agree with one another between a plan view and a cross-sectional view corresponding thereto. Moreover, in the following description, the same names and reference signs represent the same or equivalent members in principle, and detailed explanations thereof may be omitted as appropriate.

First Embodiment

Figure 2:
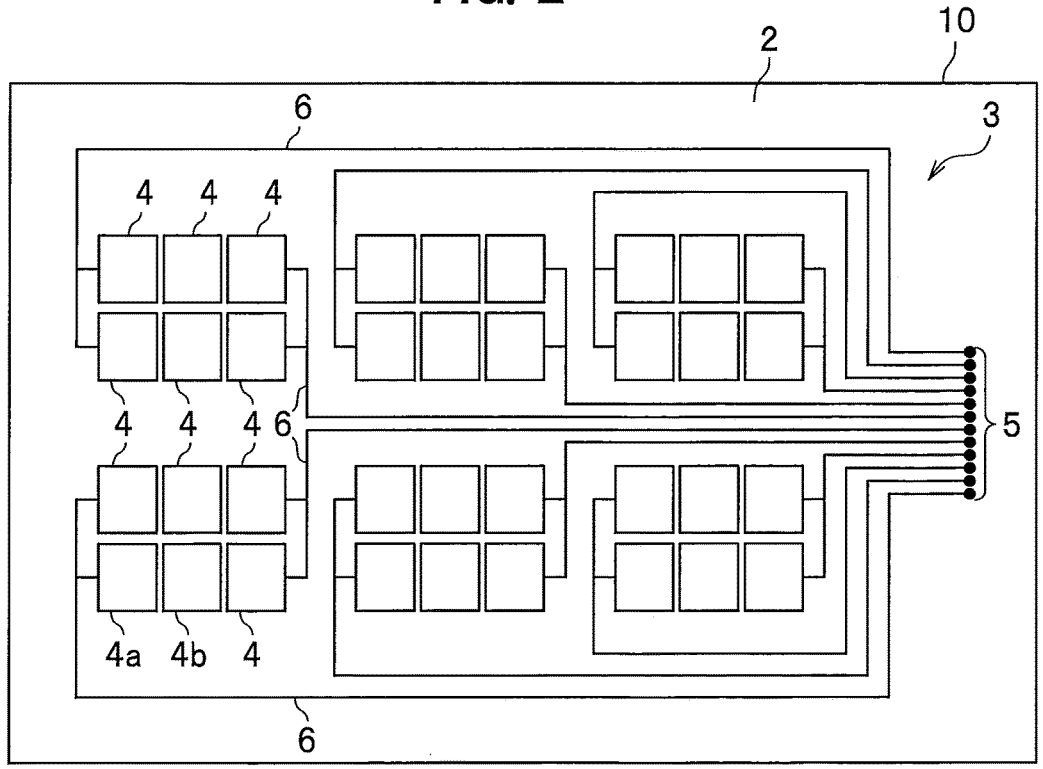
FIG. 2 is a plan view showing a printed board of the first embodiment.
Figure 3:
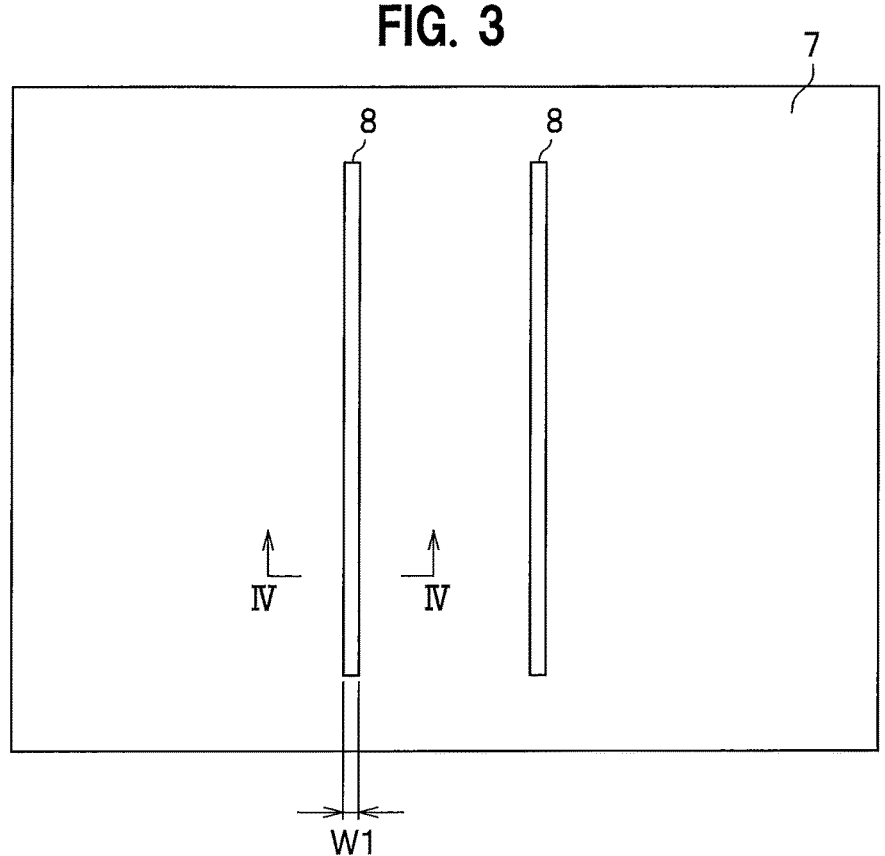
FIG. 3 is a plan view showing a metal foil provided with through-holes in accordance with the method of manufacturing a printed board of the first embodiment.
Figure 4:
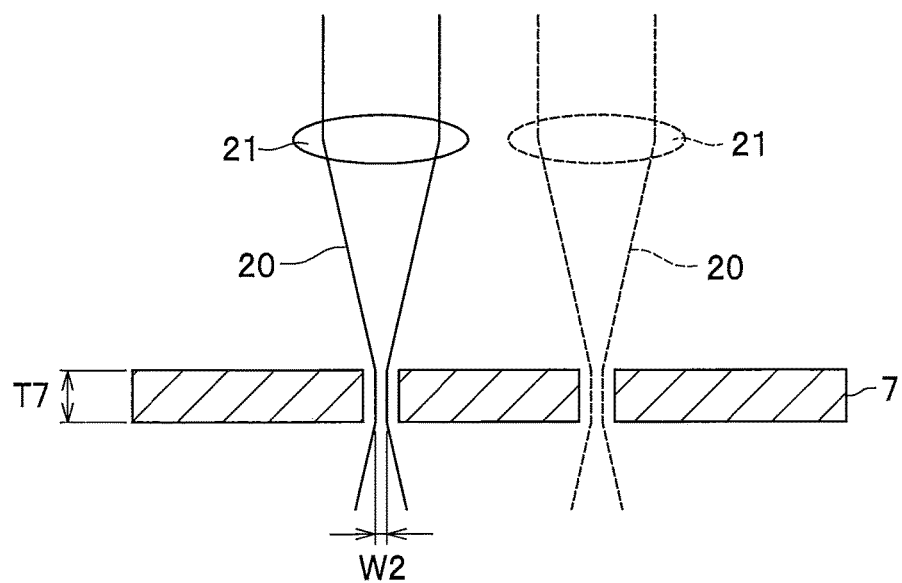
FIG. 4 is a cross-sectional view showing a through-hole foiining step in the method of manufacturing a printed board of the first embodiment, which illustrates a cross-section taken along the IV-IV line in FIG. 3.
Figure 5:
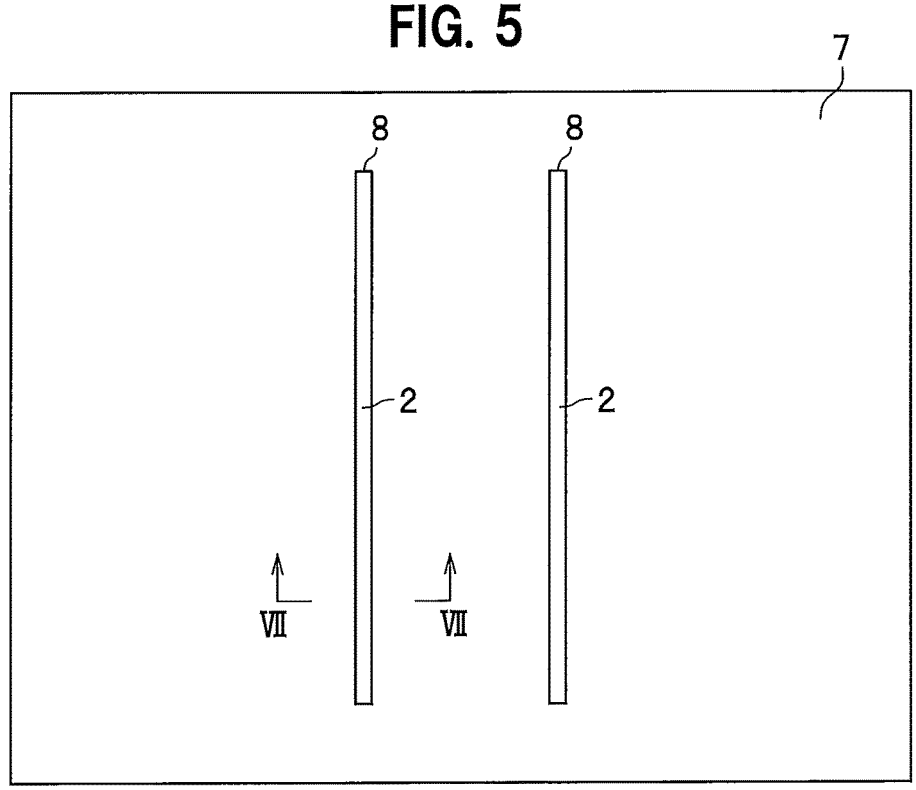
FIG. 5 is a plan view showing the metal foil bonded to an insulating layer in accordance with the method of manufacturing a printed board of the first embodiment.
Figure 6:
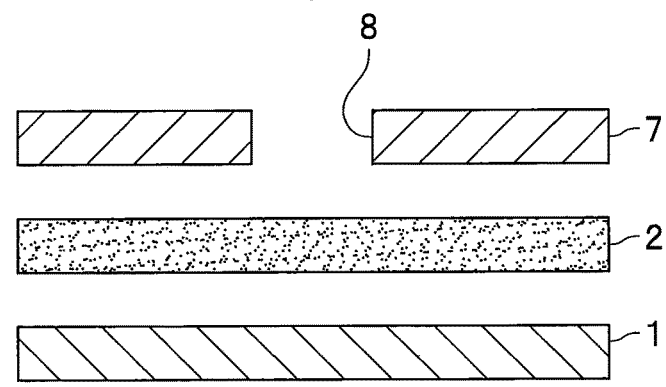
FIG. 6 is a cross-sectional view showing a layout of components before pressing in the method of manufacturing a printed board of the first embodiment.
Figure 7:
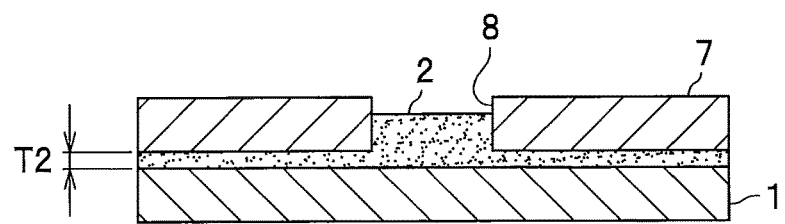
FIG. 7 is a cross-sectional view showing a layout of the components after the pressing in the method of manufacturing a printed board of the first embodiment, which illustrates a cross-section taken along the VII-VII line in FIG. 5.
Figure 8:
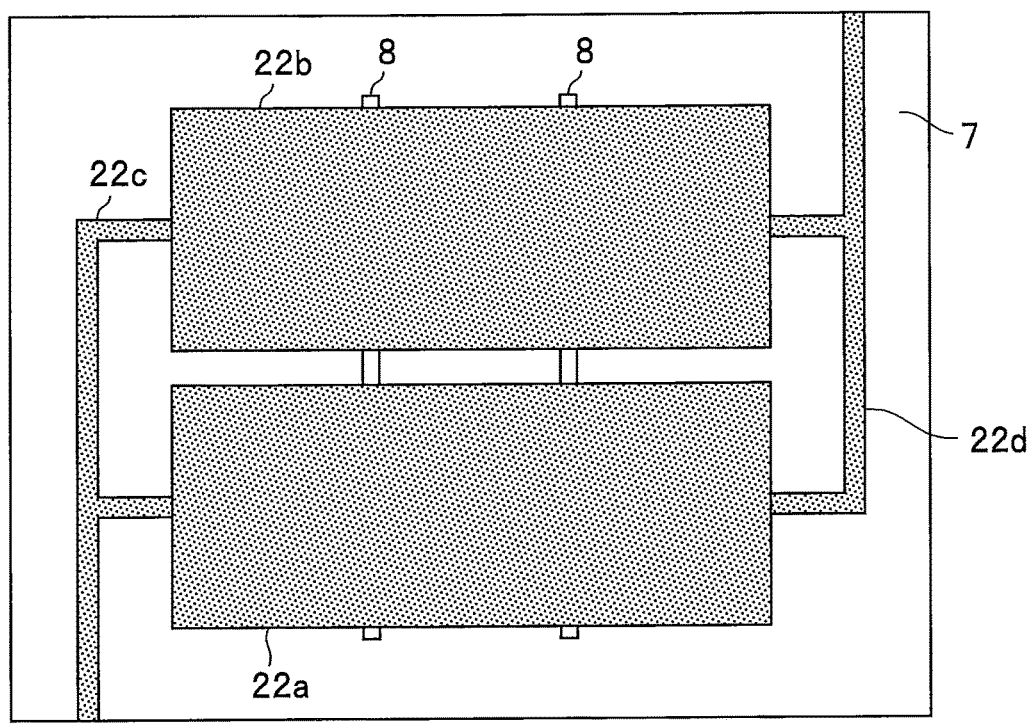
FIG. 8 is a plan view showing the metal foil provided with an etching mask in accordance with the method of manufacturing a printed board of the first embodiment.
Figure 9:
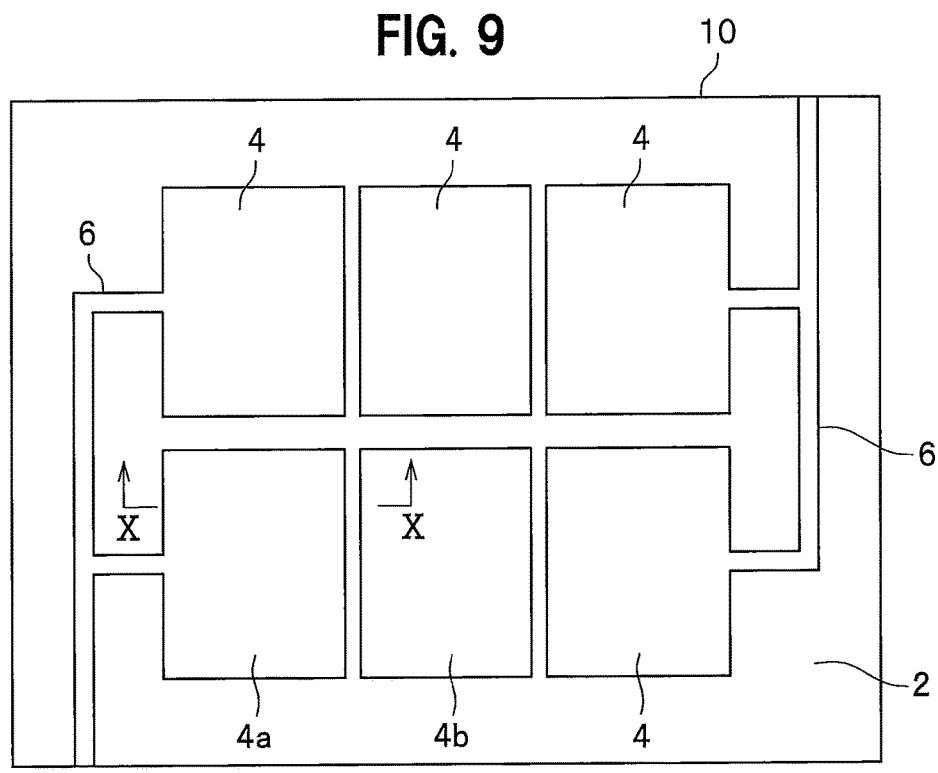
FIG. 9 is a plan view showing the printed board provided with a wiring pattern in accordance with the method of manufacturing a printed board of the first embodiment.
Figure 10:
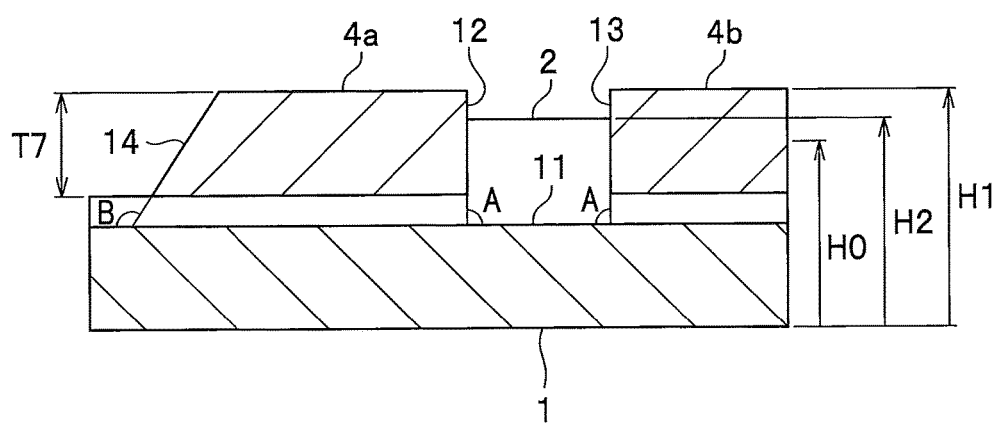
FIG. 10 is a cross-sectional view showing the printed board provided with the wiring pattern in accordance with the method of manufacturing a printed board of the first embodiment, which illustrates a cross-section taken along the X-X line in FIG. 9.

A printed board and a method of manufacturing the same according to a first embodiment will be described with reference to FIGS. 1 to 10. FIG. 1 is a flowchart showing procedures of the method of manufacturing a printed board according to the first embodiment. FIG. 2 is a plan view showing a printed board of the first embodiment. FIG. 3 is a plan view showing a metal foil provided with through-holes in accordance with the method of manufacturing a printed board of the first embodiment. FIG. 4 is a cross-sectional view showing a through-hole forming step in the method of manufacturing a printed board of the first embodiment, which illustrates a cross-section taken along the IV-IV line in FIG. 3. FIG. 5 is a plan view showing the metal foil bonded to an insulating layer in accordance with the method of manufacturing a printed board of the first embodiment. FIG. 6 is a cross-sectional view showing a layout of components before pressing in the method of manufacturing a printed board of the first embodiment. FIG. 7 is a cross-sectional view showing a layout of the components after the pressing in the method of manufacturing a printed board of the first embodiment, which illustrates a cross-section taken along the VII-VII line in FIG. 5. FIG. 8 is a plan view showing the metal foil provided with an etching mask in accordance with the method of manufacturing a printed board of the first embodiment. FIG. 9 is a plan view showing the printed board provided with a wiring pattern in accordance with the method of manufacturing a printed board of the first embodiment. FIG. 10 is a cross-sectional view showing the printed board provided with the wiring pattern in accordance with the method of manufacturing a printed board of the first embodiment, which illustrates a cross-section taken along the X-X line in FIG. 9. Note that although FIG. 8 is a plan view, the etching mask is illustrated in a hatched manner for descriptive purposes.

Configuration of Printed board

As shown in FIGS. 2, 9, and 10, a printed board 10 to be manufactured in accordance with the manufacturing method of the first embodiment includes an insulating layer 1, an adhesive 2 on the insulating layer 1, and a wiring pattern 3 formed on the adhesive 2.

The wiring pattern 3 preferably includes electrode pads 4 to mount electronic components, terminals 5 for establishing external connection, lead lines 6 for connecting the electrode pads 4 to the teiminals 5, and the like as wiring portions.

A detailed configuration of the printed board 10 will be described together with a method of manufacturing the same.

In the following, a manufacturing process will be explained while enlarging an area located at the lower left corner in the plan view of FIG. 2 where multiple (six) electrode pads 4 are to be formed. Electrode pads 4a and 4b are arranged opposite to two adjacent terminals of an electronic component to be mounted, for example. In this case, the electrode pad 4a is an electrode pad to be joined to a p-side pad electrode being one of external terminals of a light emitting element. On the other hand, the electrode pad 4b is an electrode pad to be joined to an n-side pad electrode being the other external terminal of the light emitting element.

Method of Manufacturing Printed Board

The method of manufacturing a printed board according to the first embodiment includes a preparing step S11, a through-hole forming step S12, a bonding step S13, an etching mask forming step S14, an etching step S15, and an etching mask removing step S16.

The preparing step S11 is a step of preparing an insulating material, which constitutes the insulating layer 1, and a metal foil 7 collectively as materials of the printed board 10.

The insulating layer 1 serves as a base of the printed board 10 which enables formation of the wiring pattern on its surface. In the case of the printed board for use in a light source material, the insulating material constituting the insulating layer 1 is preferably a material that develops less discoloration due to heat, or more preferably a material having high reflectivity such as a white material. A thickness of the insulating layer 1 is in a range from 15 μm to 300 μm inclusive or preferably in a range from 60 μm to 150 μm inclusive.

As for the type of the insulating material used for the insulating layer 1, a common material such as a paper phenol board, a paper epoxy board, a glass composite board, a glass epoxy board, a flexible board, and a ceramic board is applicable. Here, the paper phenol board is a board foimed by hardening a paper base material with phenol resin that contains oil or fat. The paper epoxy board is a board formed by hardening a paper base material with epoxy resin. The glass composite board is a board formed by overlapping glass fibers that are cut into even pieces and impregnating the glass fibers with epoxy resin. The glass epoxy board is a board provided with strength, insulation, and flame resistance, which is formed by hardening a glass fiber woven fabric with epoxy resin. The flexible board is a bendable board that applies a plastic film as a base material. The ceramic board is a board made of a sintered body, which is formed by sintering an inorganic substance such as alumina, aluminum nitride, and silicon carbide with a heat treatment.

The insulating material used for the insulating layer 1 may also be a material framed from any of the following resins. For example, the insulating material may be one or more of resins selected from the group consisting of epoxy resin, polyimide resin, polyethylene terephthalate resin, polyethylene naphthalate resin, bismaleimide-triazine resin, phenol resin, silicone resin, modified silicone resin, epoxy-modified silicone resin, and aromatic polyester resin (a liquid crystal polymer).

Here, in order to impart high-strength and high-toughness performances, the insulating layer 1 preferably contains one or more of reinforcing materials selected from the group consisting of a glass fiber material, a ceramic fiber material, a carbon fiber material, and an aramid fiber material.

Meanwhile, in order to impart a heat dissipation performance, the insulating layer 1 preferably contains inorganic filler having high heat conductivity. Such inorganic filler is containing one or more of the group consisting of silica, alumina, aluminum nitride, boron nitride, silicon carbide, magnesium oxide, zinc oxide, and aluminum hydroxide.

In the meantime, a heat dissipation plate with high heat dissipation may be attached to a surface of the insulating layer 1 on the opposite side of the surface to bond the metal foil 7.

The metal foil 7 forms the wiring pattern to be bonded to the surface of the insulating layer 1. The metal foil 7 has a thickness T7 (see FIG. 4) in a range from 2 μm to 120 um inclusive or preferably in a range from 2 μm to 35 μm. The metal constituting the metal foil 7 is either a metal selected from the group consisting of Cu, Ag, Au, Ni, Fe, and Al or an alloy containing any of these metals as a main component. As the metal constituting the metal foil 7, it is preferable to use any of Cu, Ag, and Au having excellent heat conductivity, or more preferable to use any of electrolytic Cu or rolled Cu. Meanwhile, when a thin-layer metal foil is used, it is also possible to use the metal foil integrated with a carrier metal foil or a carrier resin.

The through-hole forming step S12 is a step of forming through-holes 8 through the metal foil 7 by using a laser beam or by punching. In this step, a very small through-hole 8 is formed in each predetermined area to locate a wiring portion that needs to have a narrow pitch such as an interval between a p-electrode pad and an n-electrode pad in the wiring pattern 3. The shape of each through-hole 8 is not limited to any particular shape and can be formed, for example, into any of a circle, an ellipse, an elongate hole, a rectangle, a comb-tooth shape (FIG. 28), and the like. Each through-hole 8 shown in FIG. 3 is an elongate hole being long in one direction, which is a through-hole corresponding to an area between the electrode pad 4a and the electrode pad 4b, for example. A width W1 in a short direction of the through-hole 8 after the formation of the through-hole 8 is in a range from 10 μm to 50 μm inclusive. Here, the through-holes 8 are temporarily formed in the course of the manufacturing process. The through-holes 8 are linked and integrated with areas to be etched off the metal foil 7 by the etching to be described later. Accordingly, in the finished printed board 10, the pitch between the electrode pad 4a and the electrode pad 4b becomes equal to the width W1, for example.

In the through-hole forming step S12, the through-holes can be formed by using a laser beam with a laser beam machine or the through-holes can be formed by punching with a punching machine. In the following, an example of using the laser beam machine will be described. In this step, the metal foil 7 placed on a stage of the laser beam machine is irradiated with the laser beam, and the metal foil 7 is thus processed. During the processing, laser conditions are preferably adjusted so as not to cause fusion bonding at a contact part of the metal foil and the stage where the laser beam penetrates. Alternatively, a buffer such as a non-woven fabric may be installed between the metal foil 7 and the stage so as not to cause the fusion bonding of the metal foil 7.

Laser processing conditions are not limited to particular conditions as long as the through-holes 8 can be properly formed through the metal foil 7. Nonetheless, the following conditions are desirable.

From the viewpoint of suppressing the occurrence of unfavorable thermal damage on a processed part of the metal foil 7, an oscillation wavelength of a laser beam 20 is preferably in a range from 250 nm to 2000 nm inclusive or more preferably in a range from 250 nm to 550 nm inclusive. For example, the oscillation wavelength of the laser beam 20 is 355 nm.

From the viewpoint of increasing a processing speed, an output (laser power) of the laser beam 20 is preferably in a range from 5 W to 60 W inclusive. The laser beam 20 is a pulsed laser beam and a pulse width of the laser beam 20 is preferably in a range from 10 picoseconds to 100 nanoseconds inclusive from the viewpoint of improving processing quality. A repetition frequency of the laser beam 20 is preferably in a range from 100 kHz to 3000 kHz inclusive or more preferably in a range from 1 MHz to 3 MHz inclusive from the viewpoint of improving the processing quality.

A spot diameter W2 (see FIG. 4) of the laser beam 20 is preferably in a range from 5 μm to 30 μm inclusive from the viewpoint of narrowing the pitch during the laser processing.

A scanning speed of the laser beam 20 is not limited to a particular speed. However, the scanning speed is preferably in a range from 100 mm/sec to 3000 mm/sec inclusive from the viewpoint of increasing the processing speed.

The processing method using the laser beam is not limited to a particular method, and the laser beam may be moved along a straight line so as to faun each through-hole 8 by cutting out the metal foil 7, for example.

Meanwhile, as shown in FIG. 4, the through-holes 8 in desired sizes and shapes may be formed by hollowing out specific regions of the metal foil 7 by scanning the metal foil 7 with a laser beam in such a way as to surround the specific regions. As for the irradiation of the laser beam, each through-hole 8 to be formed may be scanned not only once but also two or more times. A focal point of the laser beam may be changed in a direction from a surface of the metal foil 7 to the inside of the metal foil 7 during the process depending on the thickness of the metal foil 7. In the example shown in FIG. 4, the focal point of the laser beam focused with a lens 21 is located inside the metal foil 7.

Here, the metal foil 7 may be provided with an alignment hole for positioning and handling the printed board 10 by means of punching or laser processing.

The bonding step S13 is a step of pressing and bonding the metal foil 7 provided with the through-holes 8 to the insulating material constituting the insulating layer 1 with the adhesive 2 interposed between the metal foil 7 and the insulating material.

The type and the form of the adhesive 2 are selected as appropriate depending on types of the metal foil 7 and the insulating layer 1 to be attached to each other. In general, an adhesive in the form of a sheet is frequently used as the adhesive 2. A thickness of the adhesive 2 is determined based on the thickness of the metal foil 7. The thickness of the adhesive 2 and a pressure in the pressing are adjusted such that the thickness of the adhesive 2 after the bonding has a uniform thickness in a range from 10 μm to 250 μm inclusive.

Examples of a resin constituting the adhesive 2 include epoxy resin, polyimide resin, phenol resin, and the like. Among them, epoxy resin is preferable in particular for its good adhesion to the metal.

Alternatively, the adhesive 2 may be an insulation adhesive. The insulation adhesive is preferably an electrically insulating material such as aluminum oxide, boron nitride, silicon carbide, magnesium oxide, and aluminum nitride. In addition, the insulation adhesive preferably contains any of highly heat conductive inorganic filler or flame retardant inorganic filler such as aluminum hydroxide.

When the light emitting element is placed on the electrode pads 4, a material having high reflectivity may be used as the adhesive 2. This makes it possible to manufacture a light source device with improved light emission efficiency.

The adhesive 2 may be a highly heat conductive adhesive. Examples of the highly heat conductive adhesive include epoxy resin, polyimide resin, silicone resin, acrylic resin, phenol resin, bismaleimide-triazine resin, and various engineering plastics. Among them, epoxy resin, polyimide resin, bismaleimide-triazine resin, and silicone resin are preferred for high electric performances and excellent heat resistance. This makes it possible to manufacture the light source device with enhanced heat dissipation efficiency of the light emitting element when the light emitting element is mounted on the electrode pads 4.

The bonding method is not limited to a particular method. As shown in FIG. 6, the adhesive 2 may be prepared separately from the insulating layer 1 or the metal foil 7, for example. In order to press and bond the metal foil 7 to the insulating layer 1, it is possible to use a vacuum heat press machine, a vacuum laminating machine or a thermal roll laminating machine. While pressing conditions and curing conditions vary depending on the adhesive 2 to be used or on the bonding method, a thickness T2 (see FIG. 7) of the adhesive 2 formed between the metal foil 7 and the insulating layer 1 after being bonded is adjusted to be a uniform thickness in a range from 10 μm to 250 μm inclusive. In the adhesive 2 after being bonded to the metal foil 7, a height of the adhesive 2 at a position opposed to the metal foil 7 has the same height as a bonding surface of the metal foil 7 except for the through-holes 8.

Since the through-holes 8 have been formed before the metal foil 7 is bonded to the insulating layer 1, the pressure at the time of pressing forms a structure in which the adhesive 2 is pushed out and thrust into the through-holes 8. In other words, after the pressing, the adhesive 2 is in a state of being thrust into each through-hole 8 and reaching a predetermined height along a side wall of the through-hole 8. In this instance, the pressing conditions are adjusted such that the adhesive 2 in the through-hole 8 rises to a height which is at least a half as large as the thickness of the metal foil 7.

In the bonding step S13, after the metal foil 7 is bonded to the insulating layer 1, the adhesive that flows out to the surrounding area is cut away so as to adjust the adhesive to the same size as that of the printed board 10.

Here, there may be a case where chips of the metal foil 7 caused by the laser processing adhere to a laser irradiated surface of the metal foil 7 and adversely affect quality of the finished printed board. In such a case, it is preferable to bond the metal foil 7 to the adhesive 2 such that the laser irradiated surface of the metal foil 7 comes into contact with the adhesive 2. Alternatively, the surface of the metal foil 7 may be cleaned and conditioned by scraping off the resin that flows onto the surface as well as deposits of the chips on the surface caused by the laser processing by use of a ceramic roll, a brush, and the like.

A seed layer as the one used in conventional plating does not exist in the printed board 10. Accordingly, a problem of side etching of side walls associated with etching of the seed layer does not have to be considered when forming the wiring pattern 3 to be described later. For this reason, it is possible to form the wiring pattern with a high aspect ratio. In the meantime, the printed board 10 can apply the metal foil 7 to constitute the wiring, which has high roughness of Rz=5 μm or above in terms of surface roughness on the surface side to be bonded to the insulating layer 1. Accordingly, it is easy to secure adhesion strength between the insulating layer 1 and the metal foil 7 thanks to an anchoring effect.

The etching mask forming step S14, the etching step S15, and the etching mask removing step S16 are a series of steps for forming the wiring pattern 3. These steps (hereinafter collectively referred to as a wiring pattern forming step) are steps of etching predetermined areas of the metal foil 7 in order to form the wiring pattern 3.

To form the wiring pattern 3, very small areas such as the area between the electrode pad 4a and the electrode pad 4b in FIG. 2 have been removed already from the metal foil 7 in the above-described through-hole forming step S12. Therefore, in this wiring pattern forming step, the wiring pattern is formed by etching the areas other than the very small areas, which have large areas that need to be widely etched off. Here, the etching can be conducted in accordance with a method similar to etching for forming a wiring pattern in a conventional method of manufacturing a printed board.

The etching mask forming step S14 is a step of masking retained regions of the metal foil so as to expose metal removal regions being the regions to be etched and removed. In this etching mask forming step S14, the predetermined areas of the metal foil 7 including the through-holes 8 are covered with the mask, while the regions to be left as the electrode pads are provided with etching mask portions 22a and 22b as shown in FIG. 8. Moreover, in the etching mask forming step S14, regions to be left as the wiring pattern are provided with etching mask portions 22c and 22d, and regions to be left as the terminals 5 are also provided with the etching mask. In the etching mask forming step S14, a dry film photoresist (DFR) formed into a sheet shape and provided with a photosensitive layer, for example, can be used in a manufacturing line for the printed board as the etching mask for forming the wiring pattern. The DFR is subjected to exposure and development, and is thus used as the etching mask.

The etching step S15 is a step of etching the metal foil 7 that is exposed after the foimation of the etching mask. The wiring pattern can be formed by removing the metal foil 7 exposed from the mask with an etchant that corresponds to the type of the metal used as the metal foil 7. Here, the areas etched off by the etching are linked to and integrated with the through-holes 8 through the metal foil 7.

The etching mask removing step S16 is a step of removing the etching mask after the etching. When the DFR is used as the etching mask, the DFR is used as the etching mask and then peeled off with an alkaline solution in general. Examples of the alkaline solution used for the peeling include aqueous solutions of hydroxides of potassium, sodium, and calcium, as well as aqueous solutions of carbonates of these alkali metal elements.

Note that the wiring pattern to be formed in the wiring pattern forming step is not limited only to the aforementioned example, and other patterns may be formed in accordance with the intended use. For instance, the wiring pattern may be formed so as to be able to construct a circuit in consideration of mounting a protection element as well as the light emitting element. The printed board 10 can be manufactured by conducting the aforementioned steps.

In FIG. 10, an area adjacent to a side surface 14 of the electrode pad 4a represents an example of a location etched in the wiring pattern forming step. At the etched location of the printed board 10, the adhesive 2 at the same height as the bonding surface of the metal foil 7 is exposed at a portion below the side surface 14 as shown in FIG. 10. The side surface 14 of the electrode pad 4a has an inclination angle B of 95° or above with respect to an upper surface 11 of the insulating layer 1. In the illustrated example, the inclination angle B is about 120°. The inclination angle B exceeds 95° because side etching occurs in an ordinary etching process.

On the other hand, in the printed board 10, side surfaces 12 and 13 of the electrode pads 4a and 4b opposed to each other correspond to the through-hole 8 through the metal foil 7, which are formed by using the laser beam or by punching and are therefore substantially perpendicular. Meanwhile, in the through-hole 8, the adhesive 2 rises to the height which is at least a half as large as the thickness of the metal foil 7. Accordingly, the etching mask comes into close contact with a surface of the adhesive 2 as well as the side surfaces 12 and 13 of the electrode pads 4a and 4b opposed to each other, and the side surfaces 12 and 13 are prevented from being subjected to the side etching in the etching step S15. As a consequence, each of the side surfaces 12 and 13 of the electrode pads 4a and 4b opposed each other has an inclination angle A in a range from 85° to 95° inclusive with respect to the upper surface 11 of the insulating layer 1 in this embodiment. When it is possible to form the electrode pads with nearly perpendicular side surfaces as described above, a distance between the electrode pads can be further reduced so that the printed board can increase its density.

In the meantime, a height H2 of the adhesive 2 between the electrode pads 4a and 4b is equivalent to a height H1 of the electrode pads 4a and 4b. Here, the term "equivalent" means that the adhesive 2 has a shape of being thrust up to the height H2 that is a half or more than the thickness T7 of the metal foil 7. Based on a lower surface of the insulating layer 1, for example, a height of an upper surface of each electrode pad 4 (a height of an upper surface of the metal foil 7) is defined as H1 while a height to a position a half as large as the thickness T7 of the metal foil 7 is defined as H0. Meanwhile, a height to a position of an upper surface of the adhesive 2 provided in an area between the electrode pad 4a and the electrode pad 4b (an area corresponding to the through-hole 8) is defined as H2. In this case, the heights satisfy a relation of H0≤H2≤H1.

As described above, the height H2 of the adhesive 2 between the electrode pads 4a and 4b is equivalent to the height H1 of the electrode pads 4a and 4b and has a small difference in level or no difference in level. Thus, it is possible to prevent solder from bridging when mounting the light emitting element or the like by using the solder.

Figure 11:
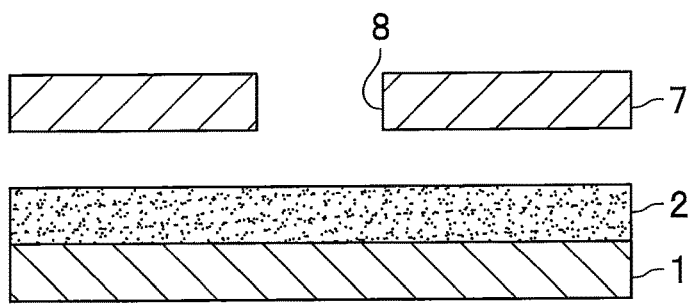
FIG. 11 is a cross-sectional view showing a first modified example of a layout of the components before the pressing in the method of manufacturing a printed board of the first embodiment.
Figure 12:
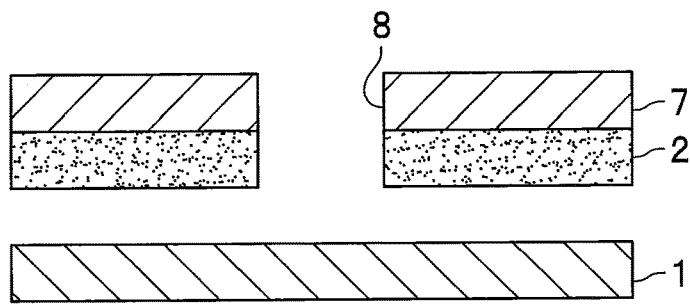
FIG. 12 is a cross-sectional view showing a second modified example of a layout of the components before the pressing in the method of manufacturing a printed board of the first embodiment.
Figure 13:
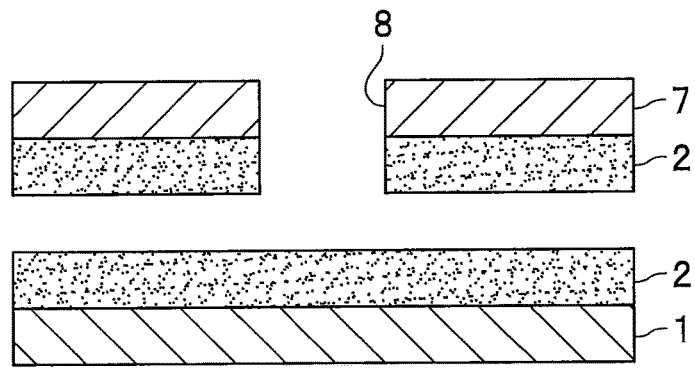
FIG. 13 is a cross-sectional view showing a third modified example of a layout of the components before the pressing in the method of manufacturing a printed board of the first embodiment.
Figure 14:
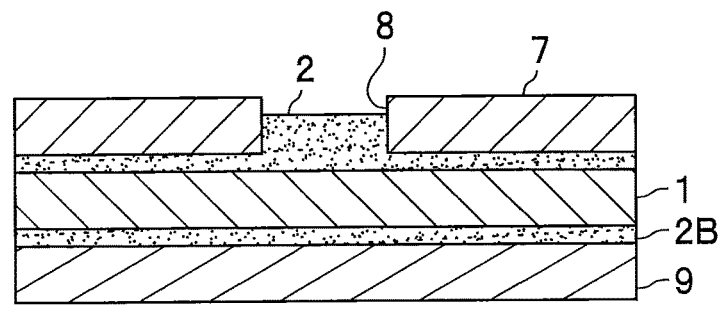
FIG. 14 is a cross-sectional view showing the printed board to which a heat dissipation plate is bonded in accordance with a modified example of the method of manufacturing a printed board of the first embodiment.

Next, modified examples of the method of manufacturing a printed board will be described with reference to FIGS. 11 to 14. FIG. 11 is a cross-sectional view showing a first modified example of a layout of the components before the pressing in the method of manufacturing a printed board of the first embodiment. FIG. 12 is a cross-sectional view showing a second modified example of a layout of the components before the pressing in the method of manufacturing a printed board of the first embodiment. FIG. 13 is a cross-sectional view showing a third modified example of a layout of the components before the pressing in the method of manufacturing a printed board of the first embodiment. FIG. 14 is a cross-sectional view showing the printed board to which a heat dissipation plate is bonded in accordance with a modified example of the method of manufacturing a printed board of the first embodiment.

In the method of manufacturing a printed board of the first modified example, the adhesive 2 is applied in advance on the insulating layer 1 in the above-described bonding step S13. The rest of the steps are conducted in a similar manner to the above-described method of manufacturing a printed board of the first embodiment. By applying the adhesive 2 on the insulating layer 1 in advance as described above, it is possible to prevent interposition of an air layer between the adhesive 2 and the insulating layer 1.

In the method of manufacturing a printed board of the second modified example, the adhesive 2 is applied in advance on the metal foil 7 in the above-described bonding step S13. To this end, the through-holes 8 are formed through the metal foil 7 provided with the adhesive 2 in the through-hole forming step S12. The rest of the steps are conducted in a similar manner to the above-described method of manufacturing a printed board of the first embodiment. By applying the adhesive 2 on the metal foil 7 in advance as described above, it is possible to prevent interposition of an air layer between the metal foil 7 and the adhesive 2.

In the method of manufacturing a printed board of the third modified example, the adhesive 2 is applied in advance on both the insulating layer 1 and the metal foil 7 in the above-described bonding step S13. The rest of the steps are conducted in a similar manner to the above-described method of manufacturing a printed board of the first embodiment. In this way, it is possible to prevent interposition of an air layer between the adhesive 2 and the insulating layer 1 as well as between the metal foil 7 and the adhesive 2.

In the method of manufacturing a printed board of the fourth modified example, a heat dissipation plate 9 is bonded to the insulating layer 1 through an adhesive 2B after the above-described bonding step S13. Thus, the printed board has a structure in which the insulating layer 1 is sandwiched between the metal foil 7 and the heat dissipation plate 9. The rest of the steps are conducted in a similar manner to the above-described method of manufacturing a printed board of the first embodiment.

A material constituting the heat dissipation plate 9 may be the same metal as the metal foil 7 or a ceramic. The metal constituting the heat dissipation plate 9 is either a metal selected from the group consisting of Cu, W, Al, Ni, and Mo or an alloy containing any of these metals as a main component. As for the ceramic, any of alumina, aluminum nitride, silicon carbide, and the like is selected. No matter which one of the metal and the ceramic the heat dissipation plate 9 is made of, the material preferably has high heat conductivity. The adhesive 2B may be the same as the adhesive 2 used for the metal foil 7 and the insulating layer 1. The adhesive 2B is preferably an adhesive sheet with high heat conductivity in order to improve its heat dissipation. This configuration makes it possible to enhance mechanical strength of the printed board 10. Moreover, it is possible to enhance heat dissipation efficiency in the case of mounting an electronic component with a large amount of heat generation on the printed board, for example. Instead of the heat dissipation plate 9, fins may be bonded as a heat sink.

In the method of manufacturing a printed board of the fifth modified example, all or part of the surfaces of the metal foil 7 are subjected to a surface treatment by plating after the formation of the wiring pattern 3. The type of the plating is not limited and an appropriate type can be selected depending on the material constituting the metal foil 7, circuit specifications, or a use application. Such types mainly include direct electrolytic gold plating, electrolytic nickel/gold plating, electroless nickel/gold plating, electroless nickel/palladium/gold plating, soft gold plating, tin plating, solder plating, and the like. Thus, it is possible to improve wettability of a bonding member such as solder on the electrode pads 4 and the terminals 5 made of the metal foil 7. It is also possible to prevent the metal foil 7 from being oxidized or corroded. Note that the slashes "/" above are used to indicate the order of lamination.

In the method of manufacturing a printed board of the sixth modified example, portions which need not be soldered are covered with a solder resist after the formation of the wiring pattern 3. The solder resist in the form of a film or a liquid can be used, and the most appropriate formation method is selected depending on the circuit specifications or the use application. Thus, it is possible to prevent adhesion of the solder to the portions which need not be soldered, and to retain electric insulation between circuits for a long period of time. Here, after the formation of the solder resist, portions which need to be soldered may be subjected to a surface treatment such as plating, rustproofing, and the like.

Second Embodiment

Figure 15:
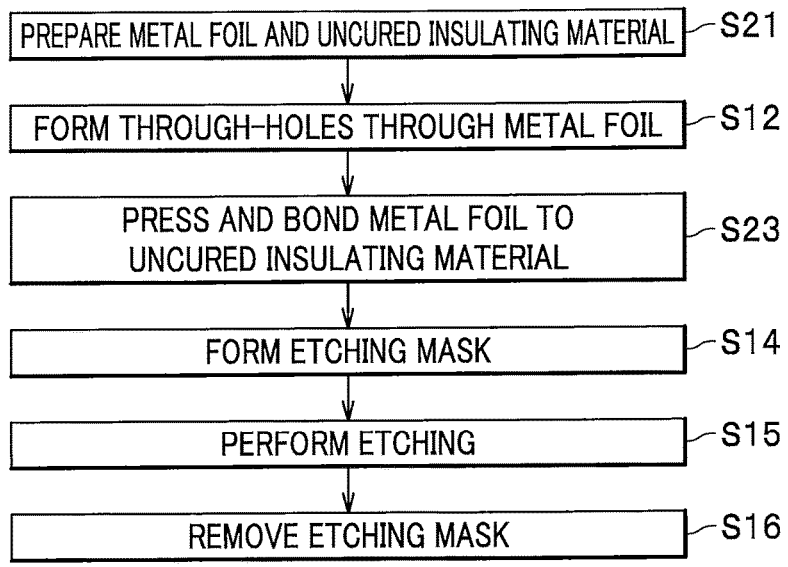
FIG. 15 is a flowchart showing procedures of a method of manufacturing a printed board according to a second embodiment.
Figure 16:
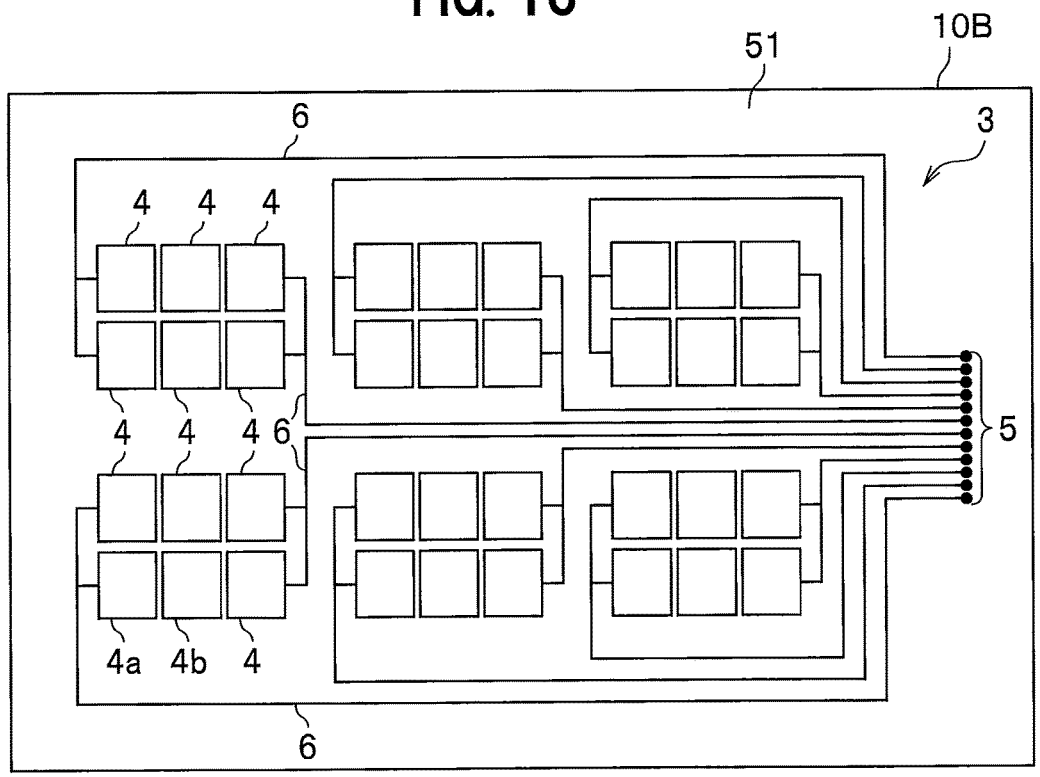
FIG. 16 is a plan view showing a printed board of the second embodiment.
Figure 17:
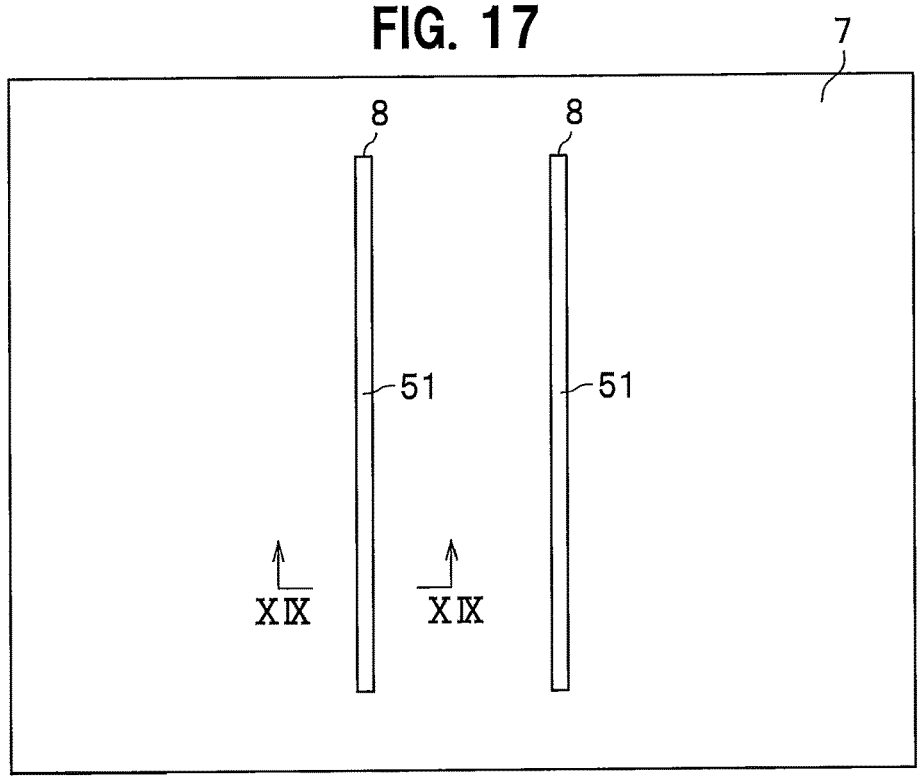
FIG. 17 is a plan view showing a metal foil bonded to an insulating layer in accordance with the method of manufacturing a printed board of the second embodiment.
Figure 18:
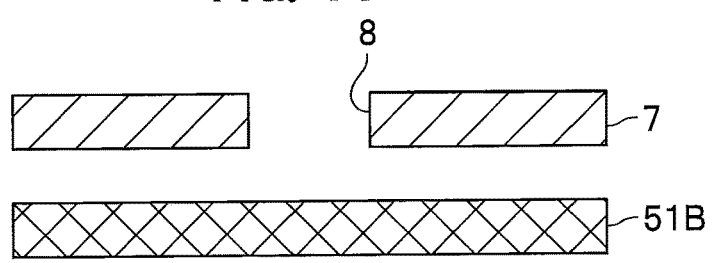
FIG. 18 is a cross-sectional view showing a layout of components before pressing in the method of manufacturing a printed board of the second embodiment.
Figure 19:
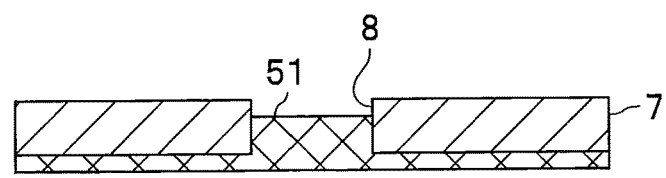
FIG. 19 is a cross-sectional view showing a layout of the components after the pressing in the method of manufacturing a printed board of the second embodiment, which illustrates a cross-section taken along the XIX-XIX line in FIG. 17.
Figure 20:
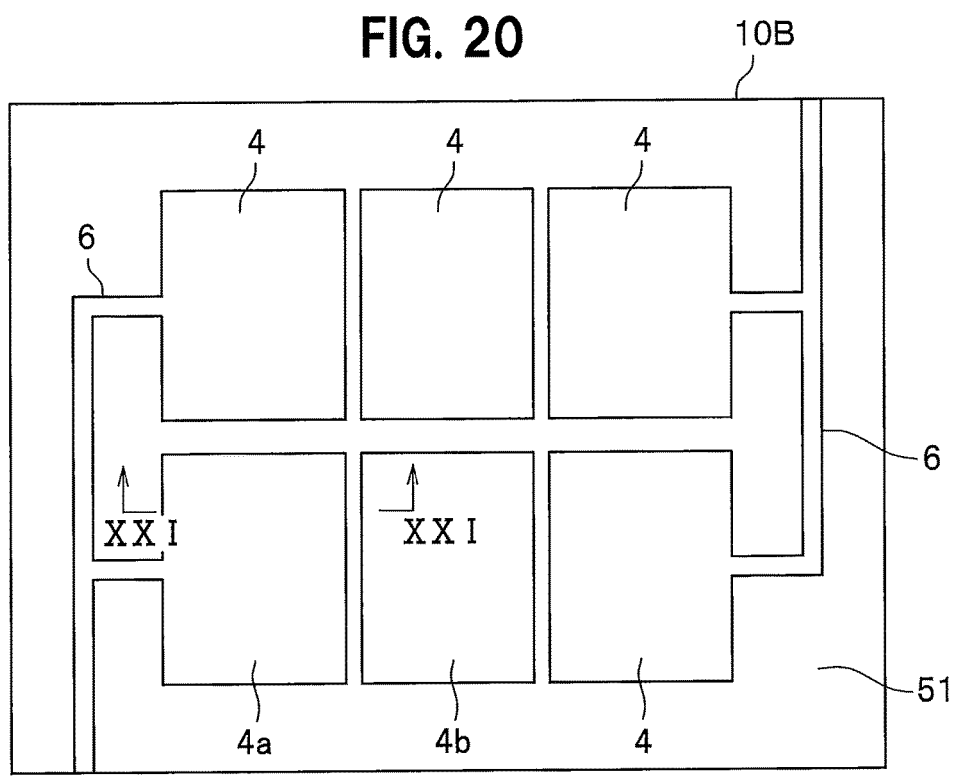
FIG. 20 is a plan view showing the printed board provided with a wiring pattern in accordance with the method of manufacturing a printed board of the second embodiment.
Figure 21:
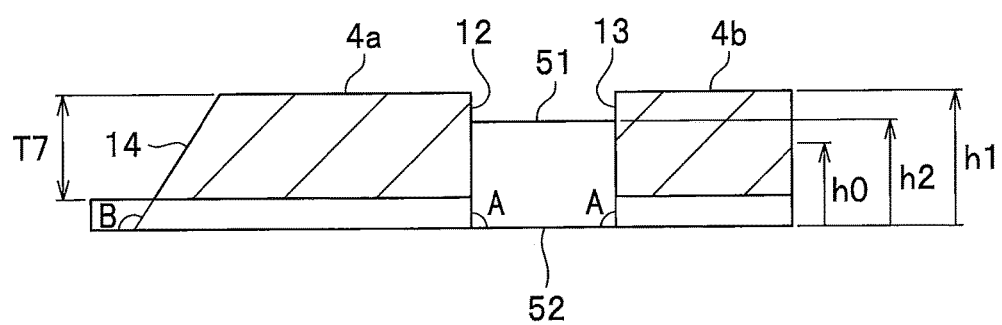
FIG. 21 is a cross-sectional view showing the printed board provided with the wiring pattern in accordance with the method of manufacturing a printed board of the second embodiment, which illustrates a cross-section taken along the XXI-XXI line in FIG. 20.

A printed board and a method of manufacturing the same according to a second embodiment will be described with reference to FIGS. 15 to 21. FIG. 15 is a flowchart showing procedures of the method of manufacturing a printed board according to the second embodiment. FIG. 16 is a plan view showing a printed board of the second embodiment. FIG. 17 is a plan view showing a metal foil bonded to an insulating layer in accordance with the method of manufacturing a printed board of the second embodiment. FIG. 18 is a cross-sectional view showing a layout of components before pressing in the method of manufacturing a printed board of the second embodiment. FIG. 19 is a cross-sectional view showing a layout of the components after the pressing in the method of manufacturing a printed board of the second embodiment, which illustrates a cross-section taken along the XIX-XIX line in FIG. 17. FIG. 20 is a plan view showing the printed board provided with a wiring pattern in accordance with the method of manufacturing a printed board of the second embodiment. FIG. 21 is a cross-sectional view showing the printed board provided with the wiring pattern in accordance with the method of manufacturing a printed board of the second embodiment, which illustrates a cross-section taken along the XXI-XXI line in FIG. 20.

Configuration of Printed board

As shown in FIGS. 16, 20, and 21, a printed board 10B to be manufactured in accordance with the manufacturing method of the second embodiment includes an insulating layer 51 and the wiring pattern 3 formed on the insulating layer 51. A detailed configuration of the printed board 10B will be described together with a method of manufacturing the same. In the following, a manufacturing process will be explained while enlarging an area located at the lower left corner in the plan view of FIG. 16 where multiple (six) electrode pads 4 are to be formed.

Method of Manufacturing Printed Board

The method of manufacturing a printed board according to the second embodiment includes a preparing step S21, the through-hole forming step S12, a bonding step S23, the etching mask forming step S14, the etching step S15, and the etching mask removing step S16.

The preparing step S21 is a step of preparing an uncured insulating material, which constitutes the insulating layer 51, and the metal foil 7 collectively as materials of the printed board 10B.

The insulating layer 51 serves as a base of the printed board 10B which enables formation of the wiring pattern on its surface. The insulating material constituting the insulating layer 51 is similar to the insulating material constituting the insulating layer 1. However, the insulating layer 51 uses an insulating material to be bonded to the metal foil 7 in an uncured state so as to replace the adhesive for bonding the metal foil to the insulating layer. Such an uncured insulating layer 51B preferably has high reflectivity and high heat conductivity. A prepreg can be used as the uncured insulating layer 51B. The prepreg is formed from a material prepared by impregnating a glass fiber cloth with a thermosetting resin. This insulating layer is different from an ordinary insulating layer in that the thermosetting resin is in a state called a B stage, where the thermosetting resin is yet to be cured completely. The B stage represents the thermosetting resin in a semi-cured state, which is characterized in that the resin once melts with an increase in temperature and is then cured completely as the resin undergoes a curing reaction with application of a high temperature.

The bonding step S23 is a step of pressing and bonding the metal foil 7 provided with the through-holes 8 to the uncured insulating material constituting the insulating layer 51. In this step, the metal foil 7 is bonded to the insulating layer 51 by using a vacuum heat press machine, for example. First, as shown in FIG. 18, a board material in a state of stacking the metal foil 7 on the uncured insulating layer 51B is put into the vacuum heat press machine, then compressed with a pressure in a range from about 2 to 4 MPa, for example, and then heated to about 120° C. Thus, the insulating layer 51B turned into a molten state is brought into close contact with the metal foil 7. Thereafter, the thermosetting resin is let stand for about 60 minutes while increasing the temperature to about 170° C., and is thus completely cured into the insulating layer 51.

Since the through-holes 8 have already been formed before the metal foil 7 is bonded to the insulating layer 51, the pressure at the time of pressing forms a structure in which the insulating layer 51B in the molten state is pushed out and thrust into the through-holes 8. In other words, after the pressing, the cured insulating layer 51 is in a state of being thrust into each through-hole 8 and reaching a predetermined height along the side wall of the through-hole 8 as shown in FIG. 19. In this instance, the pressing conditions are adjusted such that the insulating layer 51 in the through-hole 8 rises to the height which is at least a half as large as the thickness of the metal foil 7. Meanwhile, a mold release film such as a Teflon (registered trademark) sheet may be placed and pressed in order to prevent the molten part of the insulating layer 51 out of the through-holes 8 through the metal foil 7 from adhering to a hot plate of the vacuum heat press machine.

In the etching mask forming step S14, the etching step S15, and the etching mask removing step S16, the wiring pattern 3 is formed by etching predetermined areas off the metal foil 7 except very small areas such as the area between the electrode pad 4a and the electrode pad 4b in FIG. 16.

In FIG. 21, an area adjacent to the side surface 14 of the electrode pad 4a represents an example of a location etched in the wiring pattern forming step. At the etched location of the printed board 10B, the insulating layer 51 at the same height as the bonding surface of the metal foil 7 is exposed at a portion below the side surface 14 as shown in FIG. 21. The side surface 14 of the electrode pad 4a has the inclination angle B of 95° or above with respect to a lower surface 52 of the insulating layer 51.

On the other hand, in the printed board 10B, the side surfaces 12 and 13 of the electrode pads 4a and 4b that are opposed to each other correspond to the through-hole 8 through the metal foil 7, and are fanned by using the laser beam or by punching. Therefore, the side surfaces 12 and 13 are substantially perpendicular. Meanwhile, in the through-hole 8, the insulating layer 51 rises to the height which is at least a half as large as the thickness of the metal foil 7. Accordingly, the etching mask comes into close contact with a surface of the insulating layer 51 as well as the side surfaces 12 and 13 of the electrode pads 4a and 4b opposed to each other, and the side surfaces 12 and 13 are prevented from being subjected to the side etching in the etching step S15. As a consequence, each of the side surfaces 12 and 13 of the electrode pads 4a and 4b opposed each other has the inclination angle A in the range from 85° to 95° inclusive with respect to the lower surface 52 of the insulating layer 51 in this embodiment. When it is possible to form the electrode pads with nearly perpendicular side surfaces as described above, a distance between the electrode pads can be further reduced so that the printed board can increase its density.

In the meantime, a height h2 of the insulating layer 51 between the electrode pads 4a and 4b is equivalent to a height h1 of the electrode pads 4a and 4b. Here, the tei "equivalent" means that the insulating layer 51 has a shape of being thrust up to the height h2 that is a half or more than the thickness T7 of the metal foil 7. Based on the lower surface 52 of the insulating layer 51, for example, a height of the upper surface of each electrode pad 4 (a height of the upper surface of the metal foil 7) is defined as h1 while a height to the position a half as large as the thickness T7 of the metal foil 7 is defined as h0. Meanwhile, a height to a position of an upper surface of the insulating layer 51 provided in the area between the electrode pad 4a and the electrode pad 4b (the area corresponding to the through-hole 8) is defined as h2. In this case, the heights satisfy a relation of $h0 \leq h2 \leq h1$. As described above, the height h2 of the insulating layer 51 between the electrode pads 4a and 4b is equivalent to the height h1 of the electrode pads 4a and 4b and has a small difference in level or no difference in level. Thus, it is possible to prevent solder from bridging when mounting the light emitting element or the like by using the solder.

Figure 22:
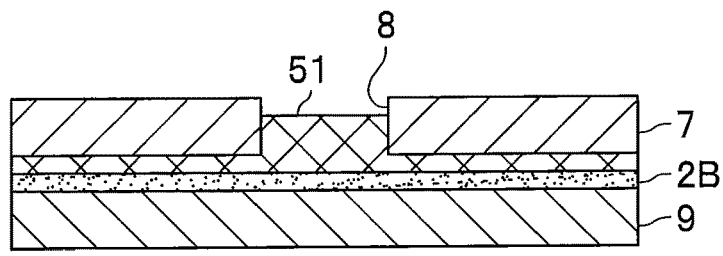
FIG. 22 is a cross-sectional view showing the printed board to which a heat dissipation plate is bonded in accordance with a modified example of the method of manufacturing a printed board of the second embodiment.
Figure 23:
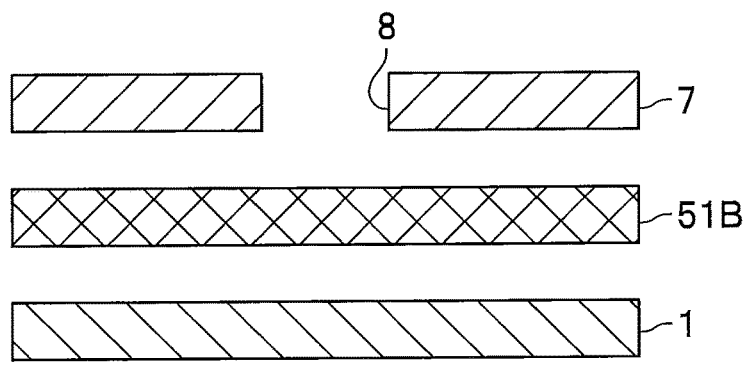
FIG. 23 is a cross-sectional view showing a layout of the components before the pressing in another modified example of the method of manufacturing a printed board of the second embodiment.
Figure 24:
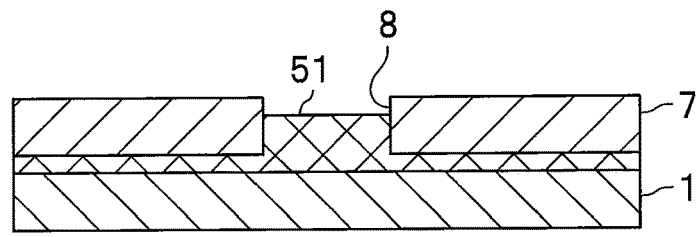
FIG. 24 is a cross-sectional view showing a layout of the components after the pressing in the other modified example of the method of manufacturing a printed board of the second embodiment.
Figure 25:
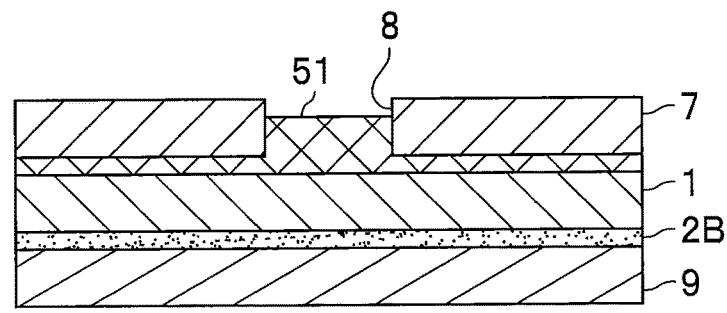
FIG. 25 is a cross-sectional view showing the printed board to which the heat dissipation plate is bonded in accordance with the other modified example of the method of manufacturing a printed board of the second embodiment.

Next, modified examples of the method of manufacturing a printed board will be described with reference to FIGS. 22 to 25. FIG. 22 is a cross-sectional view showing the printed board to which a heat dissipation plate is bonded in accordance with a modified example of the method of manufacturing a printed board of the second embodiment. FIG. 23 is a cross-sectional view showing a layout of the components before the pressing in another modified example of the method of manufacturing a printed board of the second embodiment. FIG. 24 is a cross-sectional view showing a layout of the components after the pressing in the other modified example of the method of manufacturing a printed board of the second embodiment. FIG. 25 is a cross-sectional view showing the printed board to which the heat dissipation plate is bonded in accordance with the other modified example of the method of manufacturing a printed board of the second embodiment.

In the method of manufacturing a printed board of a seventh modified example, the heat dissipation plate 9 is bonded to the insulating layer 51 through the adhesive 2B after the above-described bonding step S23. Thus, the printed board has a structure in which the insulating layer 51 is sandwiched between the metal foil 7 and the heat dissipation plate 9. The rest of the steps are conducted in a similar manner to the above-described method of manufacturing a printed board of the second embodiment. This configuration makes it possible to enhance mechanical strength of the printed board 10B and to enhance heat dissipation efficiency.

In the method of manufacturing a printed board of an eighth modified example, the uncured insulating material constituting the insulating layer 51 is pressed and bonded to the insulating material constituting the insulating layer 1 in the above-described bonding step S23. In this step, the metal foil 7, the insulating layer 51, and the insulating layer 1 are bonded together by using a vacuum heat press machine, for example. In this case, as shown in FIG. 23, a board material in a state of stacking the insulating layer 1, the uncured insulating layer 51B, and the metal foil 7 in this order from below is first put into the vacuum heat press machine, then compressed with a pressure in a range from about 2 to 4 MPa, for example, and then heated to about 120° C. Thus, the insulating layer 51B turned into a molten state is brought into close contact with the metal foil 7 and the insulating layer 1. Thereafter, the thermosetting resin is let stand for about 60 minutes while increasing the temperature to about 170° C., and is thus completely cured into the insulating layer 51 as shown in FIG. 24. The rest of the steps are conducted in a similar manner to the above-described method of manufacturing a printed board of the second embodiment. This configuration makes it possible to enhance mechanical strength of the printed board 10B. Furthermore, the heat dissipation plate 9 may be bonded to the insulating layer 1 through the adhesive 2B as shown in FIG. 25.

In the method of manufacturing a printed board of the second embodiment as well, all or part of the surfaces of the metal foil 7 may be subjected to a surface treatment by plating, or portions which need not be soldered may be covered with a solder resist after the formation of the wiring pattern 3.

Third Embodiment

Figure 26:
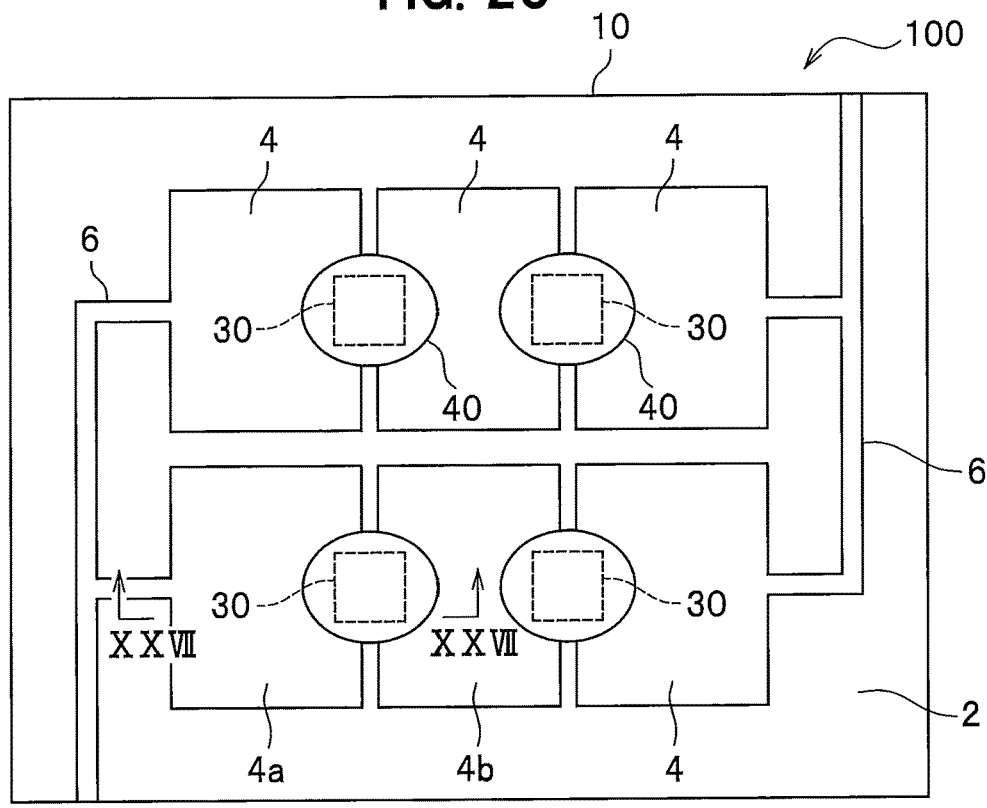
FIG. 26 is a plan view showing a light source device according to a third embodiment.
Figure 27:
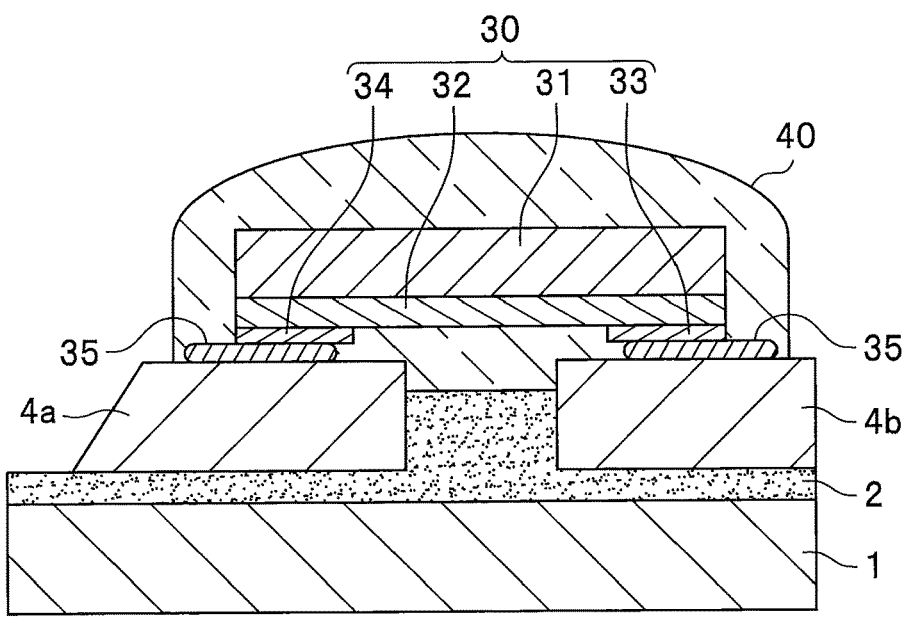
FIG. 27 is a cross-sectional view showing the light source device of the third embodiment, which illustrates a cross-section taken along the XXVII-XXVII line in FIG. 26.

Next, a light source device and a method of manufacturing the same according to a third embodiment will be described with reference to FIGS. 26 and 27. FIG. 26 is a plan view showing the light source device according to the third embodiment. FIG. 27 is a cross-sectional view showing the light source device of the third embodiment, which illustrates a cross-section taken along the XXVII-XXVII line in FIG. 26.

Configuration of Light Source Device

A light source device 100 is formed by mounting light emitting elements 30 on the printed board 10 of the first embodiment, for example. In the meantime, each light emitting element 30 is sealed with a sealing member 40. A detailed configuration of the light source device 100 will be described together with a method of manufacturing the same.

Method of Manufacturing Light Source Device

The method of manufacturing a light source device includes a printed board preparing step, a light emitting element mounting step, and a sealing step, for example.

The printed board preparing step is a step of preparing the printed board 10 in accordance with the above-described method of manufacturing a printed board of the first embodiment, for example.

The light emitting element mounting step is a step of mounting the light emitting elements 30 on the printed board 10.

Each light emitting element 30 has a substantially rectangular shape in plan view, and includes a substrate 31, a semiconductor laminated body 32, an n-side pad electrode 33, and a p-side pad electrode 34.

The light emitting element 30 is an LED chip provided with the semiconductor laminated body 32, which is prepared by laminating an n-side semiconductor layer, an active layer, and a p-side semiconductor layer using nitride semiconductor, for instance, and is provided on one of principal surfaces of the substrate 31.

In this embodiment, the light emitting element 30 is provided with the n-side pad electrode 33 and the p-side pad electrode 34 as mutually adjacent external terminals on the one surface side of the semiconductor laminated body 32. The n-side pad electrode 33 and the p-side pad electrode 34 are joined to the respective electrode pads 4a and 4b in respective element regions on the printed board 10 by using bonding members 35. Each bonding member 35 is an electrically conductive member such as solder and an anisotropic conductive adhesive.

As for modes of mounting the light emitting elements 30, in addition to flip chip mounting, it is possible to mount the light emitting elements 30 in accordance with a face-up mode by using a die bonding resin and to electrically connect the light emitting elements 30 to the electrode pads 4a and 4b by using conductive wires.

The sealing step is a step of forming the sealing members 40 so as to cover the light emitting elements 30. Each light emitting element 30 mounted on the printed board 10 is sealed with the corresponding sealing member 40. A translucent resin is applicable to the sealing members 40. Alternatively, the sealing members 40 may contain phosphor particles and the like, which absorb part or all of light from the light emitting elements 30 and convert the absorbed light into light with a different wavelength. The sealing members 40 can be fainted in accordance with a molding method using a mold, various coating methods, and the like. Meanwhile, the sealing members 40 may be provided with lenses by resin potting and the like. In the meantime, plate-like sealing members 40 may be attached to upper surfaces of the light emitting elements 30.

The light source device 100 of the third embodiment can be manufactured by conducting the above-described steps. Here, provision of the sealing members may be omitted, or members to partially cover the light emitting elements 30 may be provided instead of the sealing members. Meanwhile, the light emitting elements 30 may be mounted on the printed board 10B instead of the printed board 10. Moreover, the light source device may be formed by mounting a light emitting device, which is formed by packaging one or more light emitting elements 30, on the printed board 10 or 10B.

Fourth Embodiment

Figure 28:
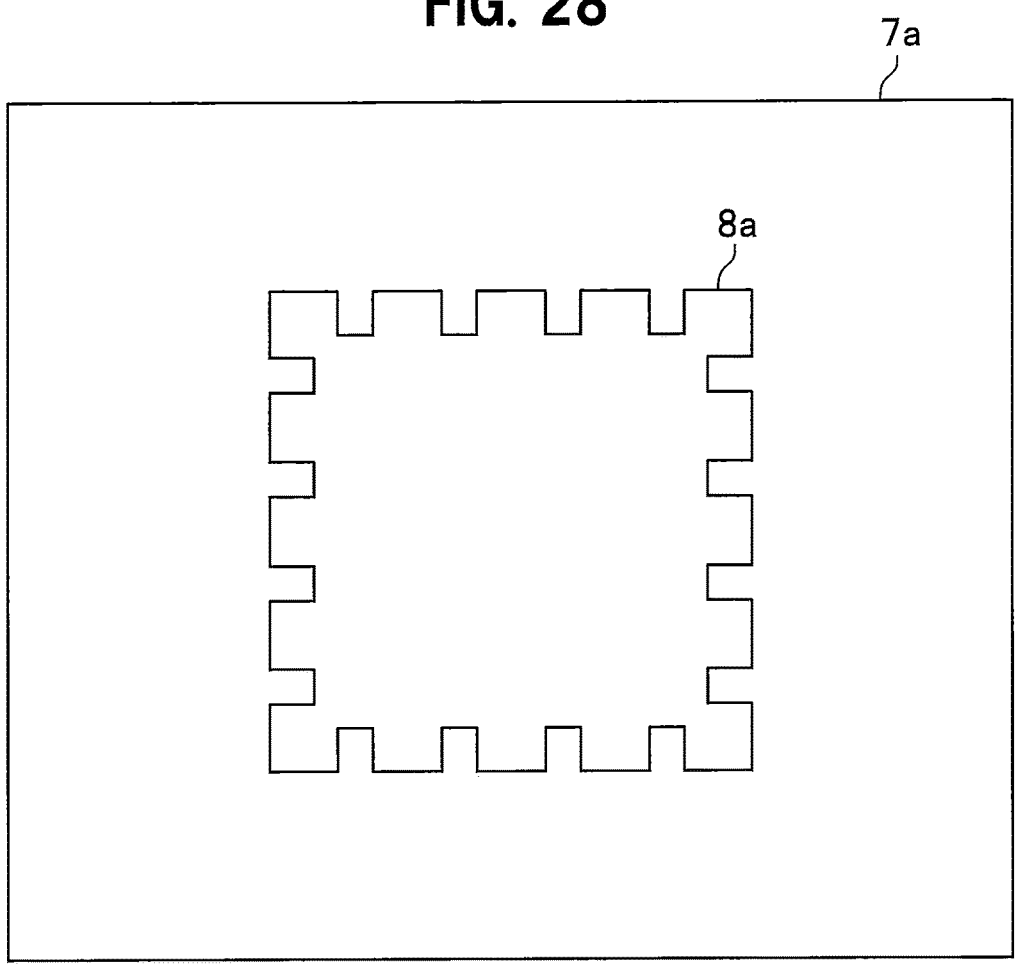
FIG. 28 is a plan view showing an example of a through-hole formed in a metal foil.
Figure 29:
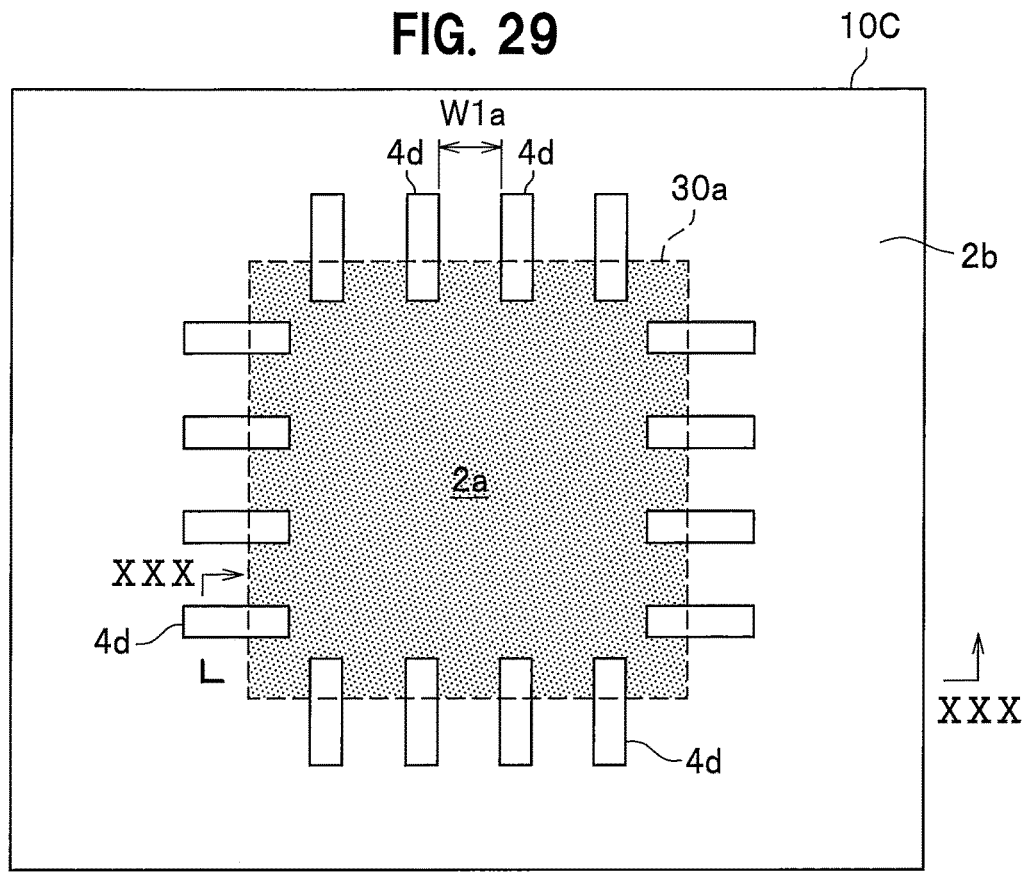
FIG. 29 is a plan view showing a printed board of a semiconductor device according to a fourth embodiment.
Figure 30:
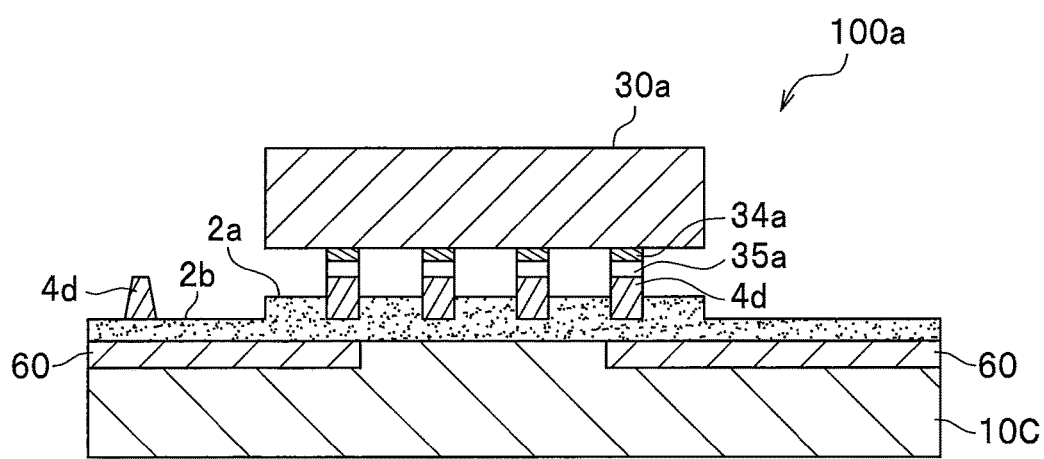
FIG. 30 is a cross-sectional view of the semiconductor device of the fourth embodiment, which corresponds to a cross-section taken along the XXX-XXX line in FIG. 29.

Next, a semiconductor device and a method of manufacturing the same according to a fourth embodiment will be described with reference to FIGS. 28 to 30. FIG. 28 is a plan view showing an example of a through-hole foamed in a metal foil. FIG. 29 is a plan view showing a printed board of the semiconductor device according to the fourth embodiment. FIG. 30 is a cross-sectional view of the semiconductor device of the fourth embodiment, which corresponds to a cross-section taken along the XXX-XXX line in FIG. 29. Note that although FIG. 29 is a plan view, an adhesive 2a located at a position higher than an adhesive 2b disposed on an upper surface is illustrated in a hatched manner for descriptive purposes.

Configuration of Semiconductor Device

A semiconductor device 100a is formed by mounting a semiconductor element 30a on a printed board manufactured in accordance with the method of manufacturing a printed board of the first embodiment, for example. A detailed configuration of the semiconductor device 100a will be described together with a method of manufacturing the same. Here, the semiconductor element is also applicable to a transistor, an integrated circuit (IC), a large-scale integrated circuit (LSI), a very large-scale integration (VLSI), an ultra large-scale integration (ULSI), and the like. In the meantime, the LSI may also function as a memory or a central processing unit (CPU), for example.

Method of Manufacturing Semiconductor Device

The method of manufacturing a semiconductor device includes a printed board preparing step, a semiconductor element mounting step, and a sealing step, for example.

The printed board preparing step is a step of preparing a printed board 10C in accordance with the above-described method of manufacturing a printed board of the first embodiment, for example.

The printed board 10C is a board used for mounting the semiconductor element 30a. Here, the semiconductor element 30a has a substantially rectangular shape in plan view, and is assumed to be a quad flat non-leaded package (QFN), for example. The semiconductor element 30a includes multiple pad electrodes 34a serving as terminals that are located on four sides on a bottom surface. Accordingly, in this case, the printed board 10C includes multiple mount pads 4d serving as wiring portions to mount the multiple pad electrodes 34a of the semiconductor element 30a.

When manufacturing the printed board 10C, a through-hole 8a in a comb-tooth shape is formed in a metal foil 7a as shown in FIG. 28 in the through-hole forming step S12 so as to be able to faun the multiple mount pads 4d. Note that FIG. 28 illustrates an enlarged view of a certain part of the area of the metal foil to be used. In the following, a manufacturing process of the certain part of the area will be briefly explained.

In the bonding step S13, the metal foil 7a provided with the through-hole 8a is pressed and bonded to the insulating material constituting the insulating layer 1 with the adhesive 2 interposed between the metal foil 7a and the insulating layer 1. Accordingly, in the finished printed board 10C, the adhesive 2a rises in spaces between the multiple mount pads 4d as shown in FIG. 30.

In the etching mask forming step S14, a predetermined area of the metal foil 7a including the through-hole 8a are covered with a mask. In this instance, an etching mask is provided to regions to be left as the multiple mount pads 4d as well as to the through-hole 8a. Subsequently, the multiple mount pads 4d are separated from one another by etching the metal foil 7a in the etching step S15.

Accordingly, in the finished printed board 10C, side surfaces of the mount pads 4d are substantially perpendicular in the area protected by the etching mask as shown in FIG. 30 since outer peripheral parts of the mount pads 4d are formed by using the laser beam or by punching. Meanwhile, in the etched area, inclinations of the side surfaces of the mount pads 4d are increased. In the meantime, a height of the adhesive 2a in the area protected by the etching mask becomes larger than a height of the adhesive 2b in an area where the metal foil is removed by the etching. For this reason, the mount pads 4d can be formed more closely adjacent to one another or at narrower pitches as compared to cases of using the semi-additive method, the subtractive method, and the like.

A predetermined wiring pattern is fol. med by removing the etching mask after the etching. The printed board 10C can be manufactured by conducting the aforementioned steps.

Here, the through-hole 8a in the comb-tooth shape is preferably foi lied such that a width W1 a being the pitch of two adjacent mount pads 4d in the finished product is in a range from 10 μm to 50 μm inclusive.

Meanwhile, the printed board 10C can also apply a multilayer board including inner layer wiring 60 or apply a build-up board as needed. Furthermore, the mount pads 4d formed by using the through-hole 8a can also be provided on two surfaces of the board.

The semiconductor element mounting step is a step of mounting the semiconductor element 30a on the printed board 10. The semiconductor element 30a is formed by stacking an n-type semiconductor layer, an active layer, and a p-type semiconductor layer on a substrate made of Si or Ga—As, for example, and then providing a wiring layer. In the meantime, the semiconductor element 30a includes the multiple pad electrodes 34a fanned from a thin-film metal, for example, which are joined to the multiple mount pads 4d of the printed board 10C by using bonding members 35a.

The semiconductor device 100a of the fourth embodiment can be manufactured by conducting the aforementioned steps. Here, instead of flip chip mounting the semiconductor element, the semiconductor element may be mounted in accordance with a face-up mode by using a die bonding resin, and electrically connected to the mount pads 4d by using conductive wires. In the meantime, it is also possible to conduct a sealing step of sealing the semiconductor element with a sealing member in order to improve reliability. The sealing member used in the sealing step can apply the same material as those described above. Note that the type of the package of the semiconductor element is not limited only to the QFN, and other types such as a quad flat package (QFP), a pin grid array (PGA), and a ball grid array (BGA) are also applicable.

While the printed board, the light source device, the semiconductor device, and the methods of manufacturing the same according to this disclosure have been specifically described above with reference to certain embodiments, it is to be understood that the scope of the present invention is not limited to the above descriptions but should be interpreted in a broad sense based on the definition of the appended claims. Moreover, it is needless to say that various modifications, alterations and the like based on these descriptions are also encompassed by the scope of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A printed board comprising:
   an insulating layer;
   an adhesive layer on the insulating layer; and
   a wiring pattern provided on the adhesive layer, the adhesive layer having an adhesive layer bottom surface contacting the insulating layer and an adhesive layer top surface opposite to the adhesive layer bottom surface in a thickness direction along a thickness of the printed board, the wiring pattern having a wiring pattern bottom surface contacting the adhesive layer and a wiring pattern top surface opposite to the wiring pattern bottom surface in the thickness direction, the wiring pattern including two wiring portions on which two adjacent terminals of an electronic component to be mounted, respectively, each of side surfaces of the two wiring portions opposed to each other having an inclination angle with respect to the insulating layer in a range from 85° to 95° inclusive, each of other side surfaces of the wiring portions having an inclination angle with respect to the insulating layer equal to or above 95°, the adhesive layer top surface between the two wiring portions being provided between the wiring pattern bottom surface and the wiring pattern top surface in the thickness direction.

2. The printed board according to claim 1,
   wherein the adhesive layer top surface between the two wiring portions is provided between the wiring pattern top surface and a middle thickness position of the wiring pattern, the middle thickness position of the wiring pattern being a middle position between the wiring pattern bottom surface and the wiring pattern top surface in the thickness direction.

3. The printed board according to claim 2,
   wherein the adhesive layer top surface is provided at the middle thickness position of the wiring pattern in the thickness direction, or the adhesive layer top surface and the wiring pattern top surface are substantially coplanar.

4. A light source device comprising:
   the printed board according to claim 1; and
   a light emitting element or a light emitting device on the printed board.

5. A semiconductor device comprising:
   the printed board according to claim 1; and
   a semiconductor element on the printed board.

6. A method of manufacturing a printed board, comprising:
   perforating a metal foil with a laser beam or punching to provide a through-hole extending in a thickness direction along a thickness of the printed board;
   providing an insulating layer;
   providing the metal foil having the through-hole on the insulating layer in the thickness direction;
   providing an adhesive between the insulating layer and the metal foil having the through-hole;
   pressing the metal foil toward the insulating layer to bond the metal foil to the insulating layer via the adhesive;
   providing a mask on the metal foil in the thickness direction to cover at least a part of the through-hole without covering an exposed part of the metal foil; and
   etching the exposed part of the metal foil to provide a wiring pattern on the insulating layer.

7. The method according to claim 6,
   wherein the adhesive is provided between the insulating layer and the metal foil having the through-hole by providing the insulating layer on which the adhesive is applied and providing the metal foil having the through-hole via the adhesive on the insulating layer in the thickness direction.

8. The method according to claim 6,
   wherein the adhesive between the metal foil and the insulating layer after the insulating layer is bonded to the metal foil has a substantially uniform thickness in a range from 10 µm to 250 µm inclusive.

9. The method according to claim 6,
   wherein the metal foil has a thickness in a range from 2 µm to 120 µm inclusive.

10. The method according to claim 6,
    wherein the metal foil is perforated with a pulsed laser beam,
    wherein an oscillation wavelength of the pulsed laser beam is in a range from 250 nm to 2000 nm inclusive,
    wherein a laser power of the pulsed laser beam is in a range from 5 W to 60 W inclusive,
    wherein a repetition frequency of the pulsed laser beam is in a range from 100 kHz to 3000 kHz inclusive,
    wherein a pulse width of the pulsed laser beam is in a range from 10 picoseconds to 100 nanoseconds inclusive, and
    wherein a scanning speed of the pulsed laser beam is in a range from 100 mm/sec to 3000 mm/sec inclusive.

11. The method according to claim 6,
    wherein the metal foil is perforated with the laser beam such that a spot diameter of the laser beam is in a range from 5 µm to 30 µm inclusive.

12. The method according to claim 6,
    wherein the metal foil is perforated to provide the through-hole elongated in a first direction and having a width in a second direction perpendicular to the first direction, the width being in a range from 10 µm to 50 µm inclusive.

13. The method according to claim 6,
    wherein the metal foil is perforated to provide the through-hole having a comb-tooth shape having at least one pair of parallel lines.

14. A method of manufacturing a light source device, comprising:
    manufacturing a printed board having a wiring pattern according to the method according to claim 6; and
    mounting a light emitting element or a light emitting device on the wiring pattern of the printed board.

15. A method of manufacturing a semiconductor device, comprising:
    manufacturing a printed board having a wiring pattern according to the method according to claim 6; and
    mounting a semiconductor element on the wiring pattern of the printed board.

16. The method according to claim 6,
    wherein the adhesive is provided between the insulating layer and the metal foil having the through-hole by perforating the metal foil on which the adhesive is applied and providing the metal foil having the through-hole via the adhesive on the insulating layer in the thickness direction.

17. A method of manufacturing a printed board, comprising:
    perforating a metal foil with a laser beam or punching to provide a through-hole extending in a thickness direction along a thickness of the printed board;
    providing an uncured insulating layer;
    providing the metal foil having the through-hole on the uncured insulating layer in the thickness direction;

pressing the metal foil toward the insulating layer to bond the metal foil to the insulating layer;

providing a mask on the metal foil in the thickness direction to cover at least a part of the through-hole without covering an exposed part of the metal foil; and etching the exposed part of the metal foil to provide a wiring pattern.

18. A printed board comprising:

an insulating layer having an insulating layer top surface; and a wiring pattern provided on the insulating layer top surface, the wiring pattern having a wiring pattern bottom surface contacting the insulating layer top surface and a wiring pattern top surface opposite to the wiring pattern bottom surface in a thickness direction along a thickness of the printed board, the wiring pattern including two wiring portions on which two adjacent teituinals of an electronic component to be mounted, respectively, each of side surfaces of the two wiring portions opposed to each other having an inclination angle with respect to the insulating layer in a range from 85° to 95° inclusive, each of other side surfaces of the wiring portions having an inclination angle with respect to the insulating layer equal to or above 95°, the insulating layer top surface between the two wiring portions being provided between the wiring pattern bottom surface and the wiring pattern top surface in the thickness direction.

19. The printed board according to claim 18, wherein the insulating layer top surface between the two wiring portions is provided between the wiring pattern top surface and a middle thickness position of the wiring pattern, the middle thickness position of the wiring pattern being a middle position between the wiring pattern bottom surface and the wiring pattern top surface in the thickness direction.

20. The printed board according to claim 19, wherein the insulating layer top surface is provided at the middle thickness position of the wiring pattern in the thickness direction, or the adhesive layer top surface and the wiring pattern top surface are substantially coplanar.

\* \* \* \* \*